(12) United States Patent
Park et al.

(10) Patent No.: US 9,558,822 B2
(45) Date of Patent: Jan. 31, 2017

(54) RESISTIVE MEMORY DEVICE AND METHOD OF OPERATING THE RESISTIVE MEMORY DEVICE

(71) Applicant: SAMSUNG ELECTRONICS CO., LTD., Suwon-Si, Gyeonggi-Do (KR)

(72) Inventors: Hyun-Kook Park, Anyang-Si (KR); Yeong-Taek Lee, Seoul (KR); Dae-Seok Byeon, Seongnam-Si (KR); Yong-Kyu Lee, Hwaseong-Si (KR); Hyo-Jin Kwon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 56 days.

(21) Appl. No.: 14/695,922

(22) Filed: Apr. 24, 2015

(65) Prior Publication Data
US 2015/0380086 A1    Dec. 31, 2015

(30) Foreign Application Priority Data

Jun. 27, 2014    (KR) ........................ 10-2014-0079948

(51) Int. Cl.
*G11C 11/00*    (2006.01)
*G11C 13/00*    (2006.01)
*G11C 11/56*    (2006.01)

(52) U.S. Cl.
CPC ....... *G11C 13/0069* (2013.01); *G11C 11/5614* (2013.01); *G11C 11/5678* (2013.01); *G11C 11/5685* (2013.01); *G11C 13/004* (2013.01); *G11C 13/0004* (2013.01); *G11C 13/0007* (2013.01); *G11C 13/0011* (2013.01); *G11C 13/0064* (2013.01); *G11C 2013/0045* (2013.01); *G11C 2013/0066* (2013.01); *G11C 2013/0073* (2013.01); *G11C 2013/0076* (2013.01); *G11C 2013/0078* (2013.01); *G11C 2013/0088* (2013.01); *G11C 2013/0092* (2013.01)

(58) Field of Classification Search
CPC .................................................... G11C 13/0002
USPC .......................................................... 365/148
See application file for complete search history.

(56) References Cited

U.S. PATENT DOCUMENTS

| | | | |
|---|---|---|---|
| 7,826,248 B2 | 11/2010 | Xi et al. | |
| 7,911,824 B2 | 3/2011 | Kawai et al. | |
| 7,948,790 B2 | 5/2011 | Tsukamoto et al. | |
| 7,960,224 B2 | 6/2011 | Chien et al. | |
| 7,961,494 B2 | 6/2011 | Scheuerlein | |

(Continued)

OTHER PUBLICATIONS

Yu, Shimeng, "On the Stochastic Nature of Resistive Switching in Metal Oxide RRAM: Physical Modeling, Monte Carlo Simulation, and Experimental Characterization," IEEE 2011, pp. 17.3.1-17.3.4.

*Primary Examiner* — Hoai V Ho
(74) *Attorney, Agent, or Firm* — Volentine & Whitt, PLLC

(57) ABSTRACT

In operating a resistive memory device including a number of memory cells, a write pulse is applied to each of the plurality of memory cells such that each of the memory cells has a target resistance state between a first reference resistance and a second reference resistance higher than the first reference resistance. The resistance of each of the memory cells is read by applying a verify pulse to each of the plurality of memory cells. A verify write current pulse is applied to each of the memory cells that has resistance higher than the second reference resistance, and a verify write voltage pulse is applied to each of the memory cells that has resistance lower than the first reference resistance.

20 Claims, 25 Drawing Sheets

(56) References Cited

U.S. PATENT DOCUMENTS

| | | |
|---|---|---|
| 8,111,563 B2 | 2/2012 | Kim et al. |
| 2010/0027326 A1* | 2/2010 | Kim .................. G11C 13/0069 365/163 |
| 2012/0236624 A1 | 9/2012 | Costa et al. |
| 2013/0051164 A1 | 2/2013 | Chang et al. |
| 2013/0201750 A1 | 8/2013 | Lee et al. |
| 2013/0235648 A1 | 9/2013 | Kim et al. |

* cited by examiner

RESISTIVE MEMORY DEVICE AND METHOD OF OPERATING THE RESISTIVE MEMORY DEVICE

CROSS-REFERENCE TO RELATED APPLICATION

This application claims the benefit of Korean Patent Application No. 10-2014-0079948, filed on Jun. 27, 2014, in the Korean Intellectual Property Office, the disclosure of which is incorporated herein in its entirety by reference.

BACKGROUND

The inventive concept relates to memory devices, and more particularly, to a resistive memory device and a method of operating the resistive memory device.

Next generation memory devices having nonvolatile characteristics without aid of refresh operations have been continuously developed with the need for high integration density and low power consumption of memory devices. The next generation memory devices need to be designed to have high integration density characteristics of dynamic random access memory (DRAM) devices, nonvolatile characteristics of flash memory devices, and high speed characteristics of static random access memory (SRAM) devices. Phase change random access memory (PRAM or PcRAM) devices, nano floating gate memory (NFGM) devices, polymer random access memory (PoRAM) devices, magnetic random access memory (MRAM) devices, ferroelectric random access memory (FRAM or FeRAM) devices and resistive random access memory (RRAM or ReRAM) devices are attracting much attention as the next generation memory devices that meet the above requirements.

SUMMARY

It is desirable to provide a resistive memory device that performs a verify write operation based on a current-voltage characteristic of the resistive memory device, thereby increasing efficiency of the verify write operation. Also desirable is to provide a method of operating a resistive memory device that performs a verify write operation based on a current-voltage characteristic of the resistive memory device, thereby increasing efficiency of the verify write operation.

Accordingly, in one aspect of the inventive concept, a method of operating a resistive memory device including a plurality of memory cells comprises applying a write pulse to each of the plurality of memory cells such that each of the plurality of memory cells has a target resistance state between a first reference resistance and a second reference resistance higher than the first reference resistance; reading resistance of each of the plurality of memory cells by applying a verify pulse to each of the plurality of memory cells; applying a verify write current pulse to each of the memory cells from among the plurality of memory cells that has resistance higher than the second reference resistance; and applying a verify write voltage pulse to each of the memory cells from among the plurality of memory cells that has resistance lower than the first reference resistance.

The method may further include, before applying the write pulse, reading an initial resistance of each of the plurality of memory cells.

The applying of the write pulse may include applying a write current pulse to each of memory cells of which initial resistances are higher than the target resistance state.

The reading may include performing a first direction verify read operation of determining whether the resistances are higher than the second reference resistance.

The method may further include, after applying the verify write current pulse, performing a second direction verify read operation of determining whether the resistances are lower than the first reference resistance.

At least one of amplitude and width of the verify write current pulse may be greater than at least one of amplitude and width of the write current pulse.

The applying of the write pulse may include applying a write voltage pulse to the memory cells of which initial resistances are lower than the target resistance state.

The reading may include performing a second direction verify read operation of determining whether the resistances are higher than the first reference resistance.

The method may further include, after applying the verify write voltage pulse, performing a first direction verify read operation of determining whether the resistances are higher than the second reference resistance.

At least one of amplitude and width of the verify write voltage pulse may be greater than at least one of amplitude and width of the write voltage pulse.

Polarities of the write voltage pulse and the verify write voltage pulse may be opposite to polarity of the verify pulse.

In accordance with another aspect of the inventive concept, a method of operating a resistive memory device including a plurality of memory cells comprises reading initial resistance of each of the plurality of memory cells; comparing each respective initial resistance with a target resistance state that is to be programmed; applying a write current pulse to each of the plurality of memory cells if its respective initial resistance is higher than the target resistance state; and applying a write voltage pulse to each of the plurality of memory cells if its respective initial resistance is lower than the target resistance state.

The method may further include reading a current resistance of each of the plurality of memory cells by applying a verify pulse to each of the plurality of memory cells to which the write current pulse or the write voltage pulse is applied.

The target resistance state may correspond to a resistance between a first reference resistance and a second reference resistance higher than the first reference resistance, and the method may further include, when the current resistance is higher than the second reference resistance, applying a verify write current pulse to each of the plurality of memory cells.

At least one of amplitude and width of the verify write current pulse may be greater than at least one of amplitude and width of the write current pulse.

The target resistance state may correspond to a resistance between a first reference resistance and a second reference resistance higher than the first reference resistance, the method further including, when the current resistance is lower than the first reference resistance, applying a verify write voltage pulse to each of the plurality of memory cells.

At least one of amplitude and width of the verify write voltage pulse may be greater than at least one of amplitude and width of the write voltage pulse.

Polarities of the write voltage pulse and the verify write voltage pulse may be opposite to polarity of the verify pulse.

In accordance with yet another aspect of the inventive concept, a memory system with resistive memory device comprises a resistive memory device including a memory cell array and a write/read circuit, the memory cell array comprising a plurality of memory cells; and a memory controller. The write/read circuit is configured in conjunction with control logic to apply a write pulse to each of the plurality of memory cells such that each of the plurality of memory cells has a target resistance state between a first reference resistance and a second reference resistance higher than the first reference resistance; to read resistance of each of the plurality of memory cells by applying a verify pulse to each of the plurality of memory cells; to apply a verify write current pulse to each of the memory cells from among the plurality of memory cells that has resistance higher than the second reference resistance; and to apply a verify write voltage pulse to each of the memory cells from among the plurality of memory cells that has resistance lower than the first reference resistance.

BRIEF DESCRIPTION OF THE DRAWING FIGURES

Exemplary embodiments of the inventive concept will be more clearly understood from the following detailed description taken in conjunction with the accompanying drawings in which.

DETAILED DESCRIPTION OF EMBODIMENTS

Figure 1:
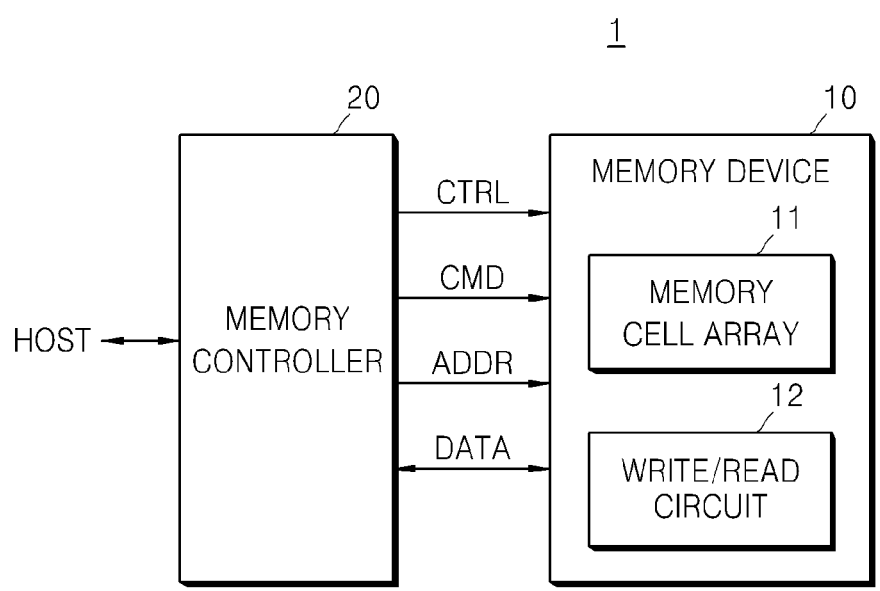
FIG. 1 is a schematic block diagram of a memory system in accordance with an embodiment of the inventive concept.

Hereinafter, the inventive concept will be described more fully with reference to the accompanying drawings, in which exemplary embodiments of the inventive concept are shown. These embodiments are provided so that this disclosure will be thorough and complete, and will fully convey the scope of the inventive concept to one of ordinary skill in the art. As the inventive concept allows for various changes and numerous embodiments, particular embodiments will be illustrated in the drawings and described in detail in the written description. However, this is not intended to limit the inventive concept to particular modes of practice, and it is to be appreciated that all changes, equivalents, and substitutes that do not depart from the spirit and technical scope of the inventive concept are encompassed in the inventive concept. In the drawings, like reference numerals denote like elements and the sizes or thicknesses of elements may be exaggerated for clarity of explanation.

The terms used in the present specification are merely used to describe particular embodiments, and are not intended to limit the inventive concept. An expression used in the singular encompasses the expression in the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

While such terms as "first," "second," etc., may be used to describe various components, such components are not be limited to the above terms. The above terms are used only to distinguish one component from another. For example, a first component discussed below could be termed a second component, and similarly, a second component may be termed a first component without departing from the teachings of this disclosure.

Unless defined differently, all terms used in the description including technical and scientific terms have the same meaning as generally understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram of a memory system 1 in accordance with an embodiment of the inventive concept. Referring to FIG. 1, the memory system 1 may include a memory device 10 and a memory controller 20. The memory device 10 may include a memory cell array 11 and a write/read circuit 12.

The memory controller 20 may control the memory device 10 such that data stored in the memory device 10 is read out or external data is stored in the memory device 10 in response to a read/write request from a host. In detail, the memory controller 20 may provide the memory device 10 with an address signal ADDR, a command signal CMD and a control signal CTRL to control a program (or write) operation, a read operation and an erasure operation of the memory device 10. Data DATA for programming the memory device 10 may be transmitted from the memory controller 20 to the memory device 10 during the program operation, and data DATA read out from the memory device 10 may be transmitted to the memory controller 20.

Although not shown in the drawings, the memory controller 20 may be configured to include a RAM device, a processing unit, a host interface, and a memory interface. The RAM device may be used as an operation memory of the processing unit. The processing unit may control the operation of the memory controller 20. The host interface may include a protocol for data exchange between the host and the memory controller 20. For example, the memory controller 20 may be configured to communicate with an external system (e.g., the host) through at least one of various interface protocols, such as a universal serial bus (USB), a multi-media card (MMC), a peripheral component interconnect express (PCI-E), an advanced technology attachment (ATA), a serial-ATA, a parallel-ATA, a small computer system interface (SCSI), an enhanced small device interface (ESDI), and/or integrated drive (or device) electronics (IDE) for example.

The memory cell array 11 may include a plurality of memory cells (not shown) respectively disposed at intersections of a plurality of first signal lines and a plurality of second signal lines. In some embodiments, the plurality of first signal lines may be a plurality of bit lines and the plurality of second signal lines may be a plurality of word lines. Alternatively, the plurality of first signal lines may be a plurality of word lines and the plurality of second signal lines may be a plurality of bit lines.

In the present embodiment, the plurality of memory cells may include resistive memory cells each having a variable resistor (not shown) having a variable resistance. For example, when the variable resistor is formed of a phase change material (e.g., Ge—Sb—Te (GST)) and resistance thereof changes in accordance with a temperature, the memory device 10 may be a phase change RAM (PRAM). In another example, when the variable resistor includes an upper electrode, a lower electrode, and transition metal oxide between the upper and lower electrodes, the memory device 10 may be a resistive RAM (RRAM). In another example, when the variable resistor includes an upper electrode of a magnetic material, a lower electrode of the magnetic material, and a dielectric material between the upper and lower electrodes, the memory device 10 may be a magnetic RAM (MRAM).

The write/read circuit 12 may perform a read operation on the plurality of memory cells and previously read an initial resistance Ri of the plurality of memory cells before performing the write operation on the plurality of memory cells. The write/read circuit 12 may perform a write operation of applying a write pulse to the plurality of memory cells such that the plurality of memory cells may have a target resistance state Rt with respect to data that is to be written. In this regard, the target resistance state Rt may be determined in advance within a range between a first reference resistance and a second reference resistance higher than the first reference resistance.

In the present embodiment, when the read initial resistance Ri is higher than the target resistance state Rt, the write/read circuit 12 may perform the write operation in a set direction by applying a write current pulse to the plurality of memory cells. When the read initial resistance Ri is lower than the target resistance state Rt, the write/read circuit 12 may perform the write operation in a reset direction by applying a write voltage pulse to the plurality of memory cells.

The write/read circuit 12 may perform a verify read operation on the plurality of memory cells to which the write pulse is applied. In this regard, the verify read operation is an operation that determines whether resistance of the plurality of memory cells to which the write pulse is applied is included in the target resistance state Rt, i.e., within the range between the first reference resistance and the second reference resistance.

In the present embodiment, the write/read circuit 12 may perform a bi-directional verify read operation on the plurality of memory cells. In more detail, the write/read circuit 12 may perform a first direction verify read operation that determines whether the resistance of the plurality of memory cells to which the write pulse is applied is higher than the second reference resistance, and may perform a second direction verify read operation that determines whether the resistance of the plurality of memory cells to which the write pulse is applied is lower than the first reference resistance.

More specifically, when current resistance of the plurality of memory cells is higher than the second reference resistance as a result of performing the first direction verify read operation, the write/read circuit 12 may apply a verify write current pulse to the plurality of memory cells. When the current resistance of the plurality of memory cells is lower than the first reference resistance as a result of performing the second direction verify read operation, the write/read circuit 12 may apply a verify write voltage pulse to the plurality of memory cells.

The memory controller 20 and the memory device 10 may be integrated into a single semiconductor device, e.g., to constitute a memory card. In some embodiments, the memory controller 20 and the memory device 10 may be integrated into a single semiconductor device to constitute a personal computer memory card international association (PCMCIA) card, a compact flash (CF) card, a smart media card (SMC), a memory stick, a multi-media card (MMC) such as a reduced size multi-media card (RS-MMC) or a MMCmicro, a secure digital (SD) card such as a mini-CD card or a micro-CD card, or a universal flash storage (UFS) for example. Alternatively, the memory controller 20 and the memory device 10 may be integrated into a single semiconductor device to constitute a solid state drive (SSD) system.

Figure 2:
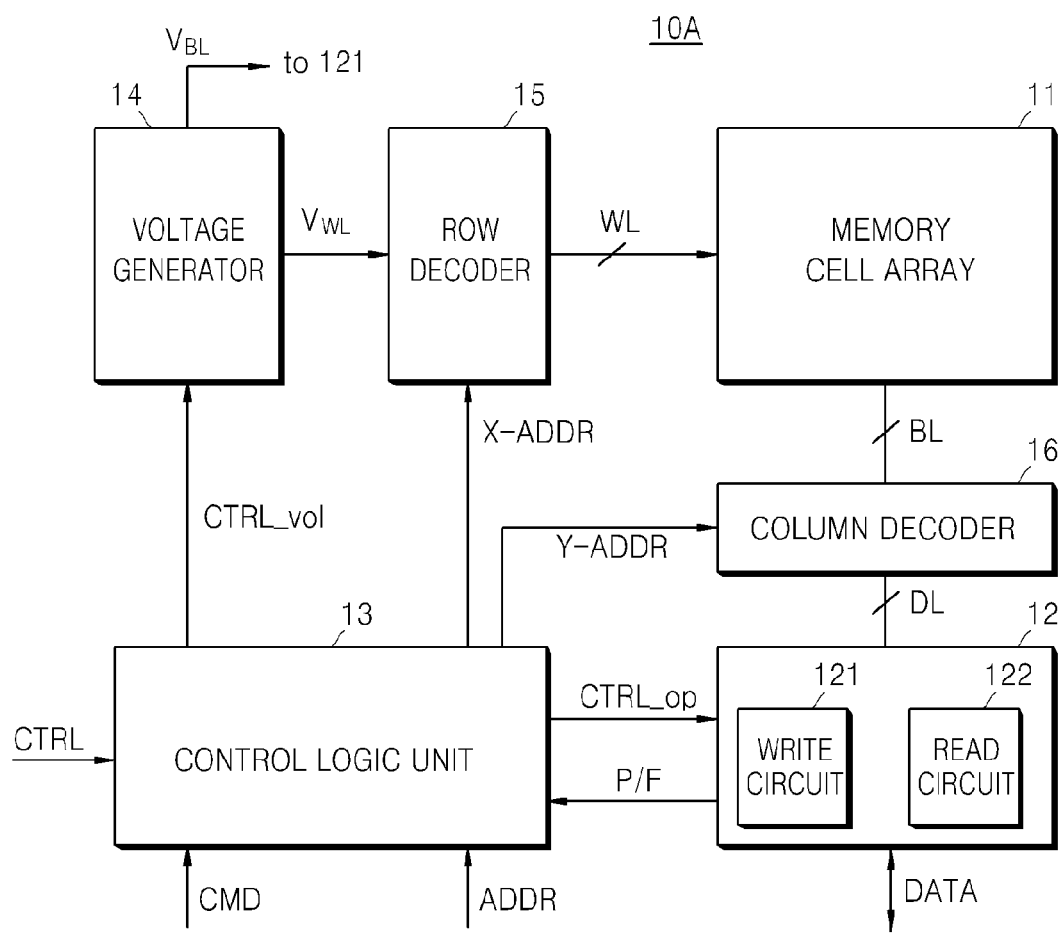
FIG. 2 is a detailed block diagram of an example of a memory device included in the memory system of FIG. 1.

FIG. 2 is a detailed block diagram of an example of a memory device 10A included in the memory system 1 of FIG. 1. Referring to FIG. 2, the memory device 10A may include the memory cell array 11, the write/read circuit 12, a control logic unit 13, a voltage generator 14, a row decoder 15, and a column decoder 16. In this regard, the write/read circuit 12 may include a write circuit 121 and a read circuit 122. The components included in the memory device 10A will now be described in detail.

The memory cell array 11 may be connected to the plurality of first signal lines and the plurality of second signal lines. The memory cell array 11 may include a plurality of memory cells respectively disposed at intersections of the plurality of first signal lines and the plurality of second signal lines. Hereinafter, embodiments of the inventive concept will be described in conjunction with an example in which the first signal lines are bit lines BL and the second signal lines are word lines WL.

Figure 3:
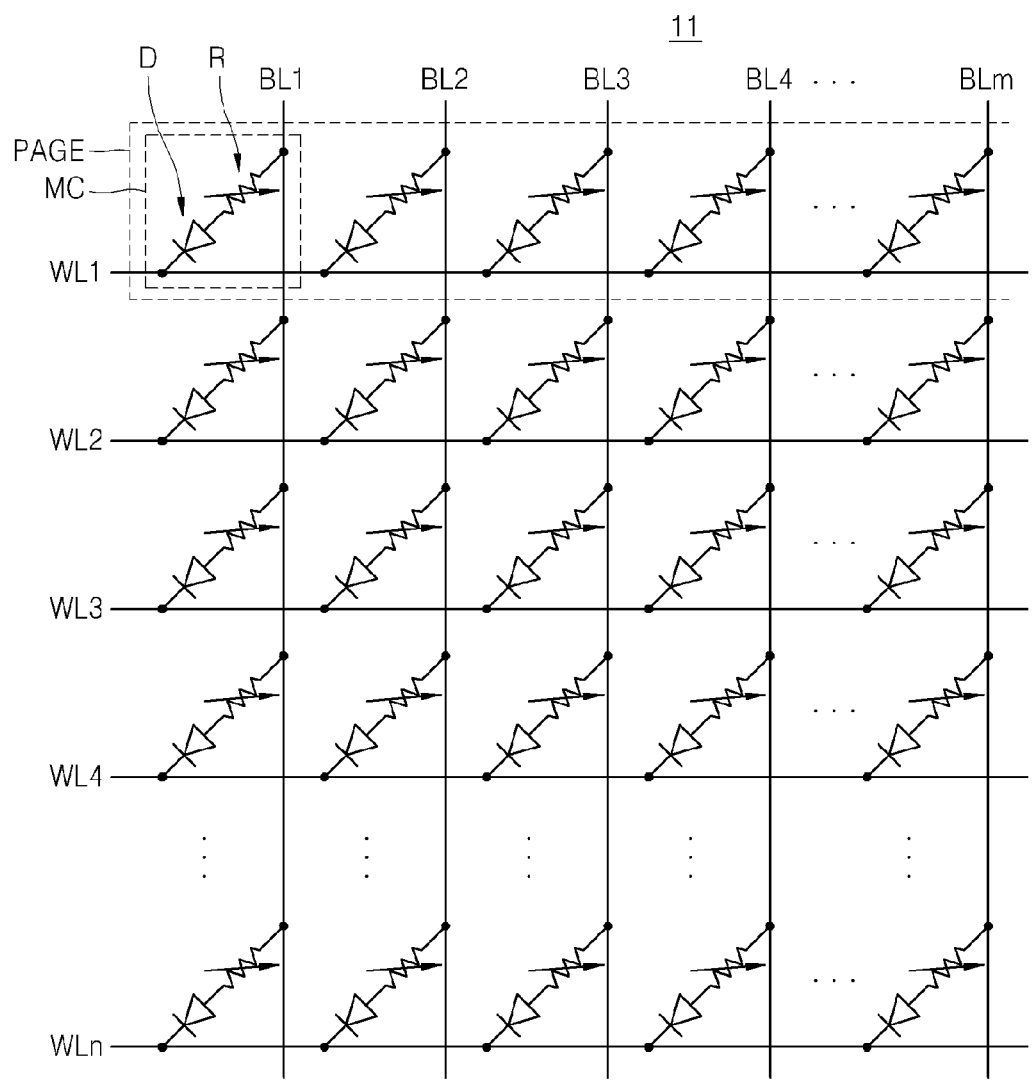
FIG. 3 is a detailed circuit diagram of the memory cell array of FIG. 2.

FIG. 3 is a detailed circuit diagram of the memory cell array 11 of FIG. 2. Referring to FIG. 3, the memory cell array 11 may be a 2D memory having a horizontal structure and may include a plurality of word lines WL1, . . . , and WLn, a plurality of bit lines BL1, . . . , and BLm, and a plurality of memory cells MC. In this regard, the number of word lines WL1, . . . , and WLn, the number of bit lines BL1, . . . , and BLm, and the number of memory cells MC may vary in accordance with embodiments. However, the inventive concept is not limited to the above configuration. The memory cell array 11 may be a 3D memory having a vertical structure in another embodiment for example.

In accordance with the present embodiment, each of the memory cells MC may include a variable resistance device R and a selection device D. The variable resistance device R may be referred to as a variable resistance material and the selection device D may be referred to as a switching element.

For example, each of the variable resistance devices R may be coupled between one of the bit lines BL1, . . . , and BLm and one of the selection devices D, and each of the selection devices D may be coupled between one of the word lines WL1, . . . , and WLn and one of the variable resistance devices R. However, the inventive concept is not limited to the above configuration. For example, each of the selection devices D may be coupled between one of the bit lines BL1, . . . , and BLm and one of the variable resistance devices R and each of the variable resistance devices R may be coupled between one of the word lines WL1, . . . , and WLn and one of the selection devices D.

Each of the selection devices D may be coupled between one of the word lines WL1 to WLn and one of the variable resistance devices R and may control an amount of current flowing through the variable resistance devices R in accordance with a voltage difference between the connected word line and the bit line. Although the selection device D is a diode in FIG. 3, this is merely an embodiment of the inventive concept. The selection device D may be changed to another switchable device in another embodiment.

Figure 4:
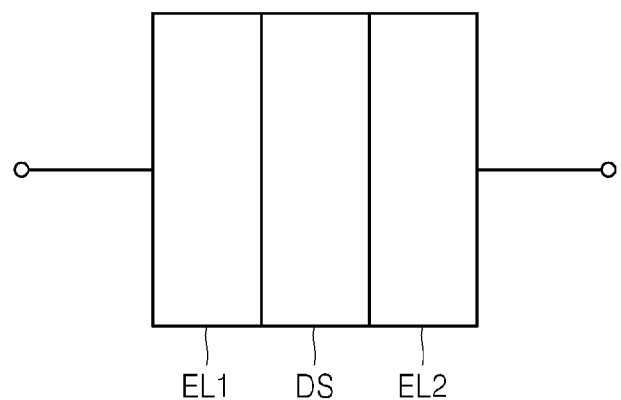
FIG. 4 illustrates an example of a variable resistor included in the memory cell of FIG. 3.

FIG. 4 illustrates an example of the variable resistance device R included in the memory cell MC of FIG. 3. Referring to FIG. 4, the variable resistance device R may include a first electrode EL1, a second electrode EL2, and a data storage film DS disposed between the first and second electrodes EL1 and EL2.

The first and second electrodes EL1 and EL2 may be formed of any of various metal materials, or metal oxide, or metal nitride. For example, the first and second electrodes EL1 and EL2 may be formed of aluminum (Al), copper (Cu), titanium nitride (TiN), titanium aluminum nitride ($Ti_xAl_yN_z$), iridium (Ir), platinum (Pt), silver (Ag), gold (Au), polysilicon, tungsten (W), titanium (Ti), tantalum (Ta), tantalum nitride (TaN), tungsten nitride (WN), nickel (Ni), cobalt (Co), chrome (Cr), antimony (Sb), iron (Fe), molybdenum (Mo), palladium (Pd), tin (Sn), zirconium (Zr), zinc (Zn), iridium oxide ($IrO_2$) or strontium zirconium oxide ($SrZrO_3$).

The data storage film DS may be formed of a bipolar resistive storage material or a unipolar resistive storage material. The bipolar resistive storage material may be programmed to have a set state or a reset state in accordance with a polarity of a pulse applied thereto. Perovskite-based materials may be used as the bipolar resistive storage material. The unipolar resistive storage material may be programmed to have a set state or a reset state even by pulses having the same polarity. Transition metal oxide materials such as a nickel oxide ($NiO_x$)material and a titanium oxide ($TiO_x$) material may be used as the unipolar resistive storage material.

FIGS. 5A through 5D are circuit diagrams of modification examples of the memory cell MC of FIG. 4.

Figure 5A:
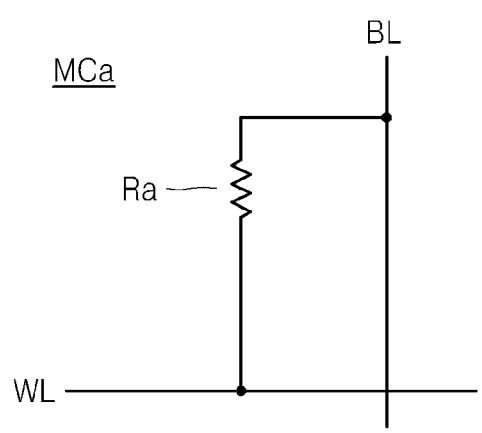
FIGS. 5A through 5D are circuit diagrams of example modifications of the memory cell of FIG. 3.

Referring to FIG. 5A, a memory cell MCa may include a variable resistance device Ra. The variable resistance device Ra may be coupled between a bit line BL and a word line WL. In an exemplary embodiment, the memory cell MCa may be programmed by voltage signals respectively applied to the bit line BL and the word line WL.

Figure 5B:
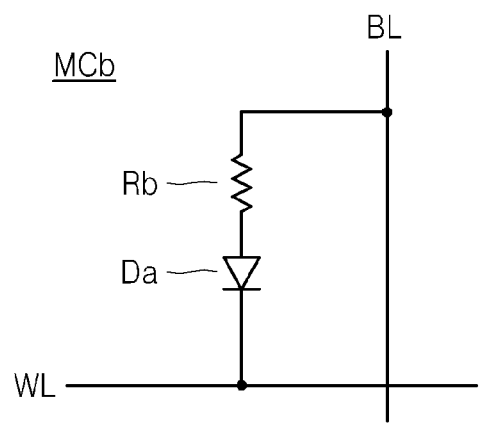

Referring to FIG. 5B, a memory cell MCb may include a variable resistance device Rb and a unidirectional diode Da connected in series. The variable resistance device Rb may include a resistive material for storing data. The unidirectional diode Da may be a selection element, that is, a switching element that supplies or blocks a current to the variable resistance device Rb in accordance with a bias condition between the word line WL and the bit line BL. The unidirectional diode Da may be coupled between the variable resistance device Rb and the word line WL, and the variable resistance device Rb may be coupled between the unidirectional diode Da and the bit line BL. In some embodiments, locations of the unidirectional diode Da and the variable resistance device Rb may be switched.

In an exemplary embodiment, the unidirectional diode Da may be a PN diode or PIN diode and have an anode connected to the variable resistance device Rb and a cathode connected to one of the word lines WL1 through WLn. In this regard, if a voltage difference between the anode and the cathode of the unidirectional diode Da is higher than a threshold voltage thereof, the the unidirectional diode Da may be turned on to supply a current to the variable resistance device Ra.

Figure 5C:
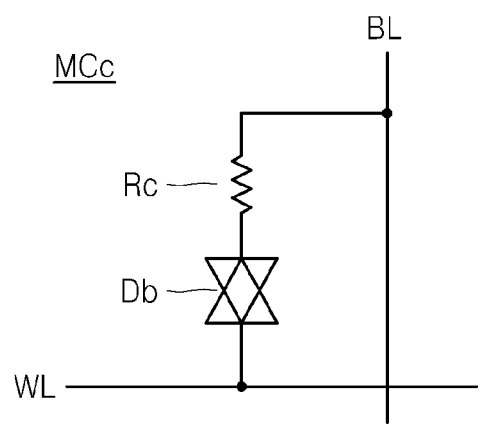

Referring to FIG. 5C, a memory cell MCc may include a variable resistance device Rc and a bidirectional diode Db. The variable resistance device Rc may include a resistive material for storing data. The bidirectional diode Db may be coupled between the variable resistance device Rc and the word line WL, and the variable resistance device Rc may be coupled between the bidirectional diode Db and the bit line BL. Locations of the bidirectional diode Db and the variable resistance device Rc may be switched. The bidirectional diode Db may prevent a leakage current from flowing through a non-selected memory cell.

Figure 5D:
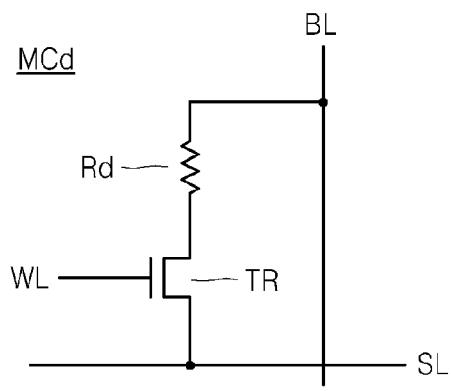

Referring to FIG. 5D, a memory cell MCd may include a variable resistance device Rd connected in series with a transistor TR. The transistor TR may be a selection device, that is, a switching device that supplies or blocks a current to the variable resistance device Rd in response to a voltage level applied to the word line WL. The transistor TR may be coupled between the variable resistance device Rd and the word line WL, and the variable resistance device Rd may be coupled between the transistor TR and the bit line BL. Locations of the transistor TR and the variable resistance device Rd may be switched. The memory cell MCd may be selected or non-selected in accordance with whether the transistor TR driven by the word line WL is turned on or turned off.

Referring back to FIG. 2, the write circuit 121 may perform a write operation by providing a write pulse to the selected memory cell MC that is connected to the selected bit line BL, and thus the data DATA that is to be stored in the memory cell array 11 may be input. In the present embodiment, the write circuit 121 may provide a write current pulse or a write voltage pulse to the selected memory cell MC in accordance with a write mode signal WMD.

In more detail, when the write mode signal WMD instructs a first write mode, the write circuit 121 may provide the write current pulse to the selected memory cell MC, and when the write mode signal WMD instructs a second write mode, the write circuit 121 may provide the write voltage pulse to the selected memory cell MC. In the present embodiment, in the first write mode, the selected memory cell MC may be programmed in a direction in which resistance of the memory cell MC decreases, and, in the second write mode, the selected memory cell MC may be programmed in a direction in which the resistance of the memory cell MC increases. In this regard, the write mode signal WMD may be received from the control logic unit 13 or the memory controller 20.

The write circuit 121 may perform a verify write operation by providing the verify write pulse to the memory cell MC to which the write pulse is provided. In the present embodiment, the write circuit 121 may provide a verify write current pulse or a verify write voltage pulse to the selected memory cell MC in accordance with the write mode signal WMD. In this regard, size of the verify write pulse may be greater than that of the write pulse. In more detail, at least one of amplitude and/or width of the verify write pulse may be greater than at least one of amplitude and/or width of the write pulse.

In more detail, when the write mode signal WMD instructs the first write mode, the write circuit 121 may provide the verify write current pulse to the selected memory cell MC, and when the write mode signal WMD instructs the second write mode, the write circuit 121 may provide the verify write voltage pulse to the selected memory cell MC. In the present embodiment, in the first write mode the selected memory cell MC may be programmed in a direction in which the resistance of the memory cell MC decreases when a first direction verify read operation is performed, and in the second write mode the selected memory cell MC may be programmed in a direction in which the resistance of the memory cell MC increases when a second direction verify read operation is performed. In this regard, the write mode signal WMD may be received from the control logic unit 13 or the memory controller 20.

The read circuit 122 may read the data DATA stored in the selected memory cell MC that is connected to the selected bit line BL, and thus the read circuit 122 may output the data DATA stored in the memory cell array 11. In more detail, the read circuit 122 may perform a general read operation on the memory cell MC when a read command is received from the memory controller 20. Before performing the write operation on the memory cell MC, the read circuit 122 may perform the read operation on the memory cell MC to perform a pre-read operation that previously reads the initial resistance Ri of the memory cell MC.

In addition, the read circuit 122 may perform a verify read operation that determines whether the write operation to the memory cell MC is completely performed after performing the write operation on the memory cell MC. In more detail, the read circuit 122 may read resistance of each of the memory cells MC to which the write pulses are applied and provide a read result to the write circuit 121 or the control logic unit 13.

In the general read operation, the read circuit 122 may provide the read data DATA to an element outside the memory device 10A, for example, to the memory controller 20. In the pre-read operation and the verify read operation, the read circuit 122 may provide the read data DATA to an element inside the memory device 10A, for example, to the control logic unit 13 or the write circuit 121, as a pass/fail signal P/F indicating a success/failure of the write operation.

The control logic unit 13 may receive the command signal CMD, the address signal ADDR, and the control signal CTRL from the memory controller 20 to output various control signals for writing the data DATA to the memory cell array 11 or for reading the data DATA out of the memory cell array 11. The control signals output by the control logic unit 13 may be provided to the write/read circuit 12, the voltage generator 14, the row decoder 15, and the column decoder 16, and thus the control logic unit 13 may control overall operations of the memory device 10A.

More specifically, the control logic unit 13 may provide various operation control signals CTRL_op to the write/read circuit 12, and the write mode signal WMD to the write circuit 121. For example, the operation control signals CTRL_op may include a write enable signal WEN, a read enable signal REN, a sense enable signal SEN, a discharge signal DIS, a precharge enable signal PRE, and a write control signal WCS, which will be described later with reference to FIGS. 12 through 14.

The control logic unit 13 may provide a voltage control signal CTRL_vol to the voltage generator 14. In more detail, in accordance with an increase in the number of program loops including the write operation and the verify operation, the control logic unit 13 may generate the voltage control signal CTRL_vol such that a level of a voltage generated by the voltage generator 14 increases (i.e. in accordance with an ISPP (Incremental Step Pulse Program) method). Furthermore, the control logic unit 13 may provide a row address signal X_ADDR to the row decoder 15 and may apply a column address signal Y_ADDR to the column decoder 16.

The voltage generator 14 may receive the voltage control signal CTRL_vol to generate various voltage signals for executing a write operation, a read operation and an erasure operation of the memory cell array 11. In detail, the voltage generator 14 may generate a first drive voltage signal $V_{WL}$ for driving the word lines WL and a second drive voltage signal $V_{BL}$ for driving the bit lines BL.

In this regard, the first drive voltage signal $V_{WL}$ may be a reset write voltage signal Vreset, an inhibition voltage signal Vinh, a read voltage signal Vread, or a program verifify voltage signal Vver. The second drive voltage signal $V_{BL}$ may be a set write voltage signal Vset, the reset write voltage signal Vreset, the inhibition voltage signal Vinh, or a control voltage signal VC.

The row decoder 15 may be connected to the memory cell array 11 through the plurality of word lines WL and may activate one selected from the plurality of word lines WL in response to the row address signal X_ADDR received from the control logic unit 13. In detail, the row decoder 15 may control a voltage applied to the selected word line WL from among the plurality of word lines WL and control a connection relationship of the selected word line WL in response to the row address signal X_ADDR.

The column decoder 16 may be connected to the memory cell array 11 through the plurality of bit lines BL and may activate one selected from the plurality of bit lines BL in response to the column address signal Y_ADDR received from the control logic unit 13. In detail, the column decoder 16 may control a voltage applied to the selected bit line BL from among the plurality of bit lines BL and control a connection relationship of the selected bit line WL in response to the column address signal Y_ADDR.

Figure 6:
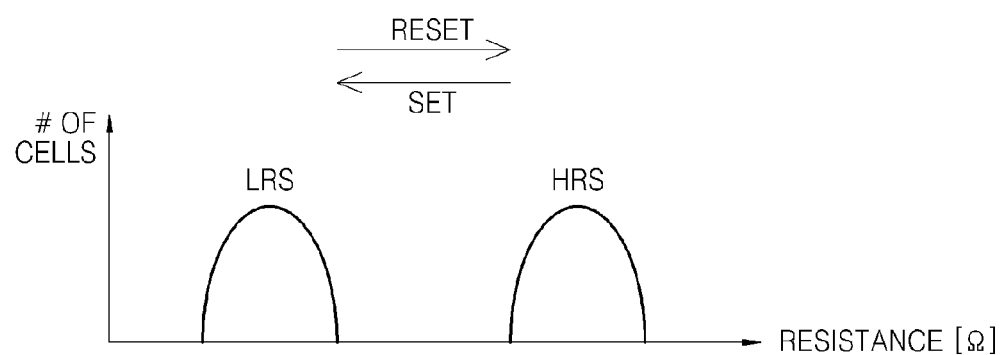
FIG. 6 is a graph showing distribution of memory cells with respect to resistance when the memory cell of FIG. 3 is a single level cell.

FIG. 6 is a graph showing a distribution of the memory cells MC with respect to resistance when the memory cell MC of FIG. 3 is a single level cell (SLC). Referring to FIG. 6, the horizontal axis represents resistance and the vertical axis represents number of memory cells MC. The graph reflects that, for example, when the memory cell MC is the SLC programmed as 1 bit, the memory cell MC may have a low resistance state LRS or a high resistance state HRS.

The low resistance state LRS and the high resistance state HRS may correspond to data "0" or data "1". In an exemplary embodiment, a resistance level R may increase from the data "0" to the data "1". That is, the low resistance state LRS may correspond to the data "0", and the high resistance state HRS may correspond to the data "1".

The operation of applying a write pulse to the memory cell MC and switching the memory cell MC from the high resistance state HRS to the low resistance state LRS may be a set operation, or a set write operation. The operation of applying the write pulse to the memory cell MC and switching the memory cell MC from the low resistance state LRS to the high resistance state HRS may be a reset operation, or a reset write operation.

Figure 7:
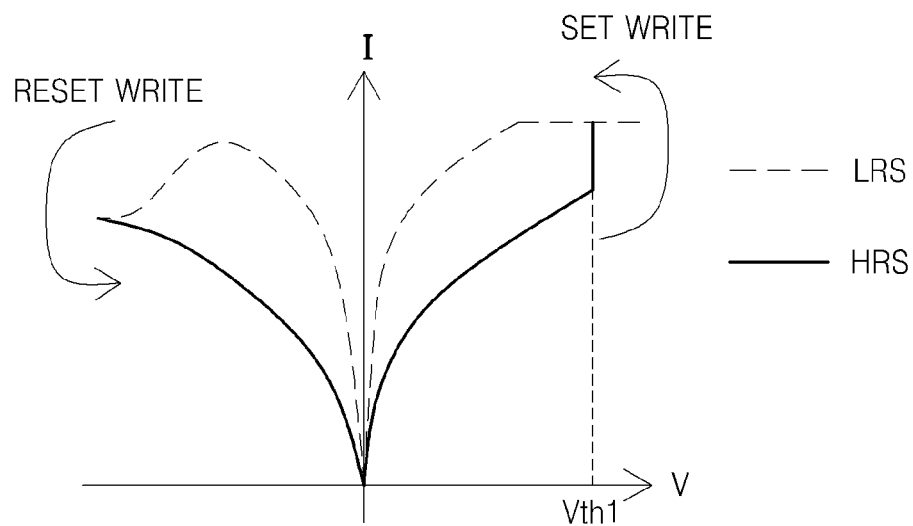
FIG. 7 is a graph showing a voltage-current characteristic curve of a memory cell having the distribution of FIG. 6.

FIG. 7 is a graph showing a voltage-current characteristic curve of the memory cell MC having the distribution of FIG. 6. Referring to FIG. 7, the horizontal axis represents voltage V and the vertical axis represents current I. When the memory cell MC is the SLC, the memory cell MC may have the low resistance state LRS or the high resistance state HRS in accordance with stored data.

When the memory cell MC is in the high resistance state HRS, if a voltage higher than a threshold voltage Vth1 is applied to the memory cell MC, since current of the memory cell MC rapidly increases, it is not easy to control current for writing a resistance level with respect to data that is to be programmed. Thus, in the present embodiment, when a set write operation is performed on the memory cell MC, a write current pulse may be applied to the memory cell MC.

Meanwhile, when the memory cell MC is in the low resistance state LRS, since current applied to the memory cell MC needs to be controlled such that the current increases up to a peak current and then decreases so as to perform a reset write operation, it is not easy to perform the reset write operation on the memory cell MC by using a general rectangular pulse. Thus, in the present embodiment, when the reset write operation is performed on the memory cell MC, a write voltage pulse may be applied to the memory cell MC.

Figure 8A:
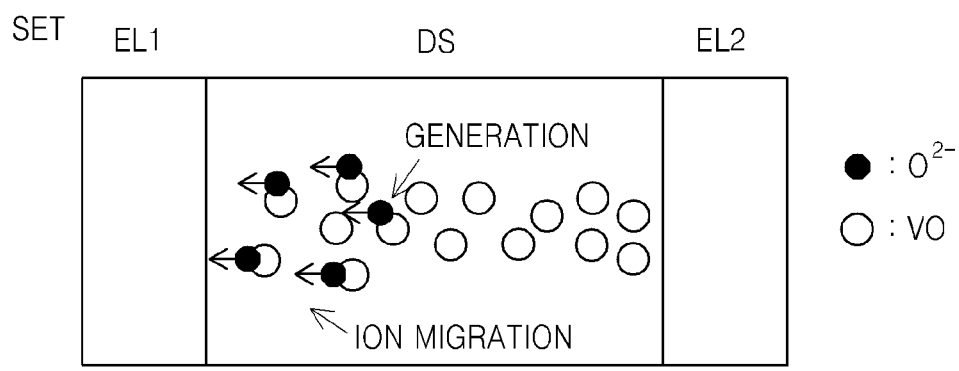
FIG. 8A and FIG. 8B illustrate set and reset operations, respectively, with respect to the memory cell of FIG. 3.
Figure 8B:
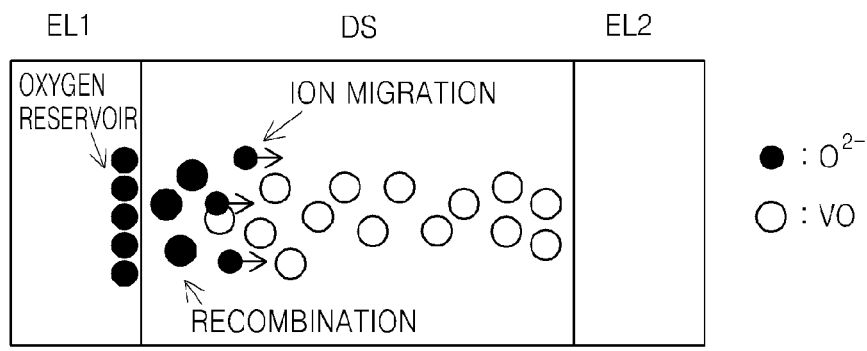

FIGS. 8A and 8B illustrate set and reset operations, respectively, with respect to the memory cell MC of FIG. 3.

Referring to FIG. 8A, when the set operation is performed on the memory cell MC, for example, when a write current pulse is applied, a voltage of the first electrode EL1 may be higher than that of the second electrode EL2. In accordance with such a difference in the voltage between the first electrode EL1 and the second electrode EL2, oxygen ions and voids Vo may be separated from each other in the data storage film DS that is a metal oxide film, and an ion migration phenomenon in which the separated oxygen ions $O^{2-}$ move in a direction of the first electrode EL1 may occur.

In accordance with such an ion migration phenomenon, a filament including the voids Vo may be generated in the data storage film DS. Thickness and density of the filament change the amplitude and width of the write current pulse applied to the memory cell MC, and thus the resistance level R of the memory cell MC changes.

Referring to FIG. 8B, when the reset operation is performed on the memory cell MC, for example, when the write current pulse is applied, the voltage of the second electrode EL2 may be higher than that of the first electrode EL1. Thus, an ion migration phenomenon in which the oxygen ions $O^{2-}$ stored in the first electrode EL1 move in a direction of the data storage film DS may occur, and accordingly the oxygen ions $O^{2-}$ are recombined with the voids Vo in the data storage film DS, and then the filament is disconnected.

Figure 9:
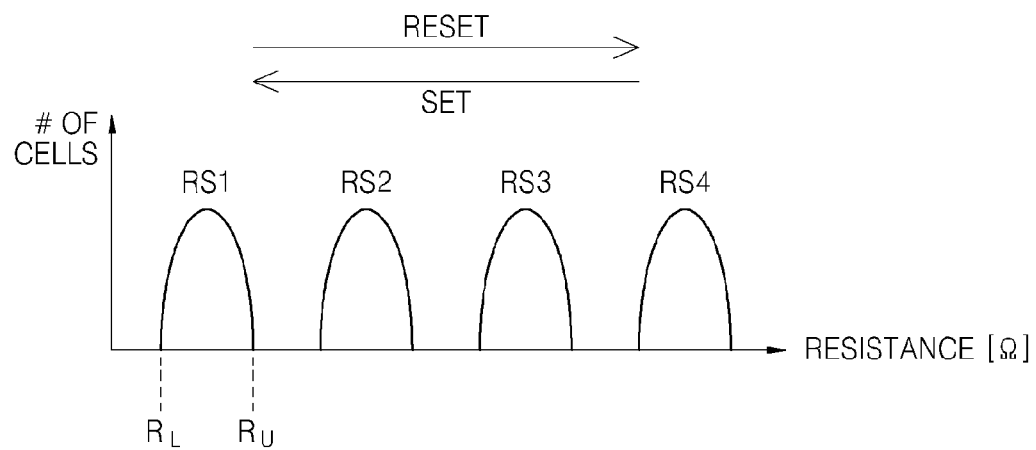
FIG. 9 is a graph showing distribution of memory cells with respect to resistance when the memory cell of FIG. 3 is a multi level cell.

FIG. 9 is a graph showing a distribution of the memory cells MC with respect to resistance when the memory cell MC of FIG. 3 is a multi level cell (MLC). Referring to FIG. 9, the horizontal axis represents resistance of the memory cells MC and the vertical axis represents number of memory cells MC. When the memory cells MC are MLCs programmed as two bits, each of the memory cells MC may have a first resistance state RS1, a second resistance state RS2, a third resistance state RS3, or a fourth resistance state RS4.

However, the inventive concept is not limited thereto. In another embodiment for example, the plurality of memory cells MC may include triple level cells (TLCs) that store data of 3 bits, and thus each memory cell may have one of 8 resistance states. In another embodiment, the plurality of memory cells may include memory cells each storing data of 4 or more bits.

In the case of MLCs as compared to SLCs, the interval between resistance states is narrow. This small resistance change may lead to occurrence of read errors of the MLCs. Thus, the first to fourth resistance states RS1, RS2, RS3 and RS4 may have resistance ranges that do not overlap with one another, so as to obtain a read margin.

Each of the first to fourth resistance states RS1, RS2, RS3 and RS4 may correspond to data '00', data '01', data '10', or data '11'. In accordance with an exemplary embodiment, resistance level R may increase in the order of data '11', data '01', data '00', and data '10'. In other words, the first to fourth resistance states RS1, RS2, RS3 and RS4 may correspond to data '11', data '01', data '00', and data '10', respectively.

For example, when the target resistance state Rt with respect to data that is to be programmed is the first resistance state RS1, the first resistance state RS1 may correspond to a range between a first reference resistance $R_L$ and a second reference resistance $R_U$ higher than the first reference resistance $R_L$. In this regard, the first reference resistance $R_L$ may refer to a low reference resistance, and the second reference resistance $R_U$ may refer to a high reference resistance.

Figure 10:
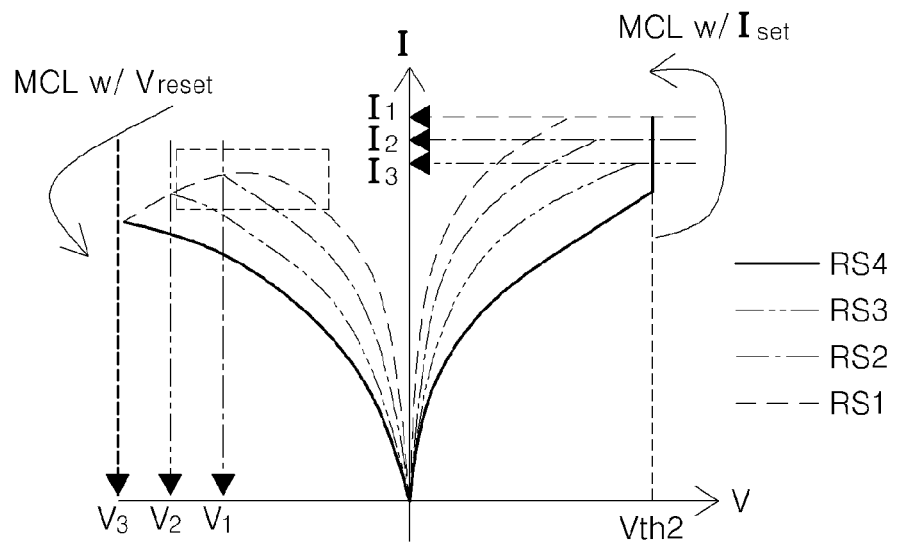
FIG. 10 is a graph showing a voltage-current characteristic curve of a memory cell having the distribution of FIG. 9.

FIG. 10 is a graph showing a voltage-current characteristic curve of the memory cell MC having the distribution of FIG. 9. Referring to FIG. 10, the horizontal axis represents voltage V and the vertical axis represents current I. When the memory cells MC are MLCs, each of the memory cells MC may have one of the first resistance state RS1, the second resistance state RS2, the third resistance state RS3, and the fourth resistance state RS4 in accordance with stored data.

When resistance of the memory cell MC is the fourth resistance state RS4 that is the highest state, if voltage higher than a threshold voltage Vth2 is applied to the memory cell MC, since current of the memory cell MC rapidly increases it is not easy to control the current for writing a resistance level with respect to data that is to be programmed. Thus, in the present embodiment, when a set write operation is performed on the memory cell MC, a write current pulse Iset may be applied to the memory cell MC.

In accordance with the present embodiment, when the size of the write current pulse Iset changes, the memory cell MC may be switched from the fourth resistance state RS4 to one of the first resistance state RS1, the second resistance state RS2, and the third resistance state RS3. In more detail, if a first write current I1 is applied to the memory cell MC, the memory cell MC may be switched from the fourth resistance state RS4 to the first resistance state RS1. If a second write current I2 is applied to the memory cell MC, the memory cell MC may be switched from the fourth resistance state RS4 to the second resistance state RS2. Furthermore, if a third write current I3 is applied to the memory cell MC, the memory cell MC may be switched from the fourth resistance state RS4 to the third resistance state RS3.

In accordance with the present embodiment, when the size of the write current pulse Iset changes, the memory cell MC may be switched from the third resistance state RS3 to the first resistance state RS1 or the second resistance state RS2. Furthermore, in accordance with the present embodiment, the memory cell MC may be switched from the second resistance state RS2 to the first resistance state RS1.

Meanwhile, when the memory cell MC is the first, second, or third resistance state RS1, RS2, or state RS3, since current applied to the memory cell MC needs to be controlled such that the current increases up to a peak current and then decreases so as to perform a reset write operation, it is not easy to perform the reset write operation on the memory cell MC by using a general rectangular pulse. Thus, in the present embodiment, when the reset write operation is performed on the memory cell MC, a write voltage pulse Vreset may be applied to the memory cell MC.

In accordance with the present embodiment, when the size of the write voltage pulse Vreset changes, the memory cell MC may be switched from the first resistance state RS1 to the second, third, or fourth resistance state RS2, RS3, or RS4. In more detail, if a first write voltage V1 is applied to the memory cell MC, the memory cell MC may be switched from the first resistance state RS1 to the second resistance state RS2. If a second write voltage V2 is applied to the memory cell MC, the memory cell MC may be switched from the first resistance state RS1 to the third resistance state RS3. If a third write voltage V3 is applied to the memory cell MC, the memory cell MC may be switched from the first resistance state RS1 to the fourth resistance state RS4.

In accordance with the present embodiment, when the size of the write voltage pulse Vreset changes, the memory cell MC may be switched from the second resistance state RS2 to the third or fourth resistance state RS3 or RS4, or from the third resistance state RS3 to the fourth resistance state RS4.

Figure 11:
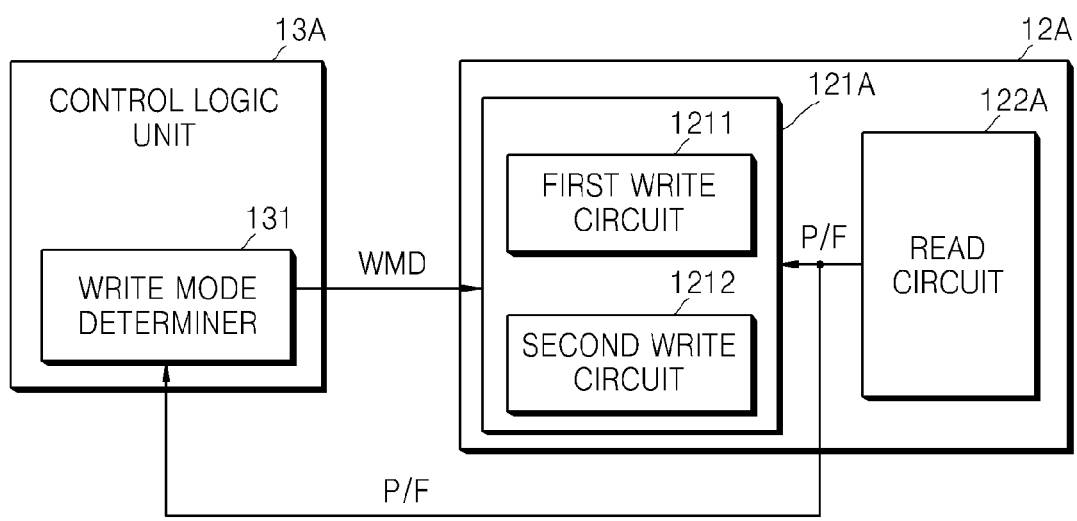
FIG. 11 is a block diagram of an example of a write/read circuit and control logic included in the memory device of FIG. 2.

FIG. 11 is a block diagram of an example of a write/read circuit 12A and a control logic unit 13A included in the memory device of FIG. 2. Referring to FIG. 11, the control logic unit 13A may include a write mode determiner 131, the write/read circuit 12A may include a write circuit 121A and a read circuit 122A, and the write circuit 121A may include a first write circuit 1211 and a second write circuit 1212.

When the write mode signal WMD instructs a first write mode, the first write circuit 1211 may be activated to perform a write operation in the first write mode. In more detail, the first write circuit 1211 may perform the write operation by providing a write current pulse or a verify write current pulse to a selected bit line.

When the write mode signal WMD instructs a second write mode, the second write circuit 1212 may be activated to perform the write operation in the second write mode. In more detail, the second write circuit 121 may perform the write operation by providing a write voltage pulse or a verify write voltage pulse to the selected bit line.

Operation of the read circuit 122A and the write mode determiner 131 when the write operation is performed will now be described. Before performing the write operation on the memory cell MC, the read circuit 122A may read the initial resistance Ri of the memory cell MC. The read circuit 122A may determine whether the read initial resistance Ri is included in the target resistance state Rt with respect to data that is to be written. In an exemplary embodiment, the read circuit 122A may determine whether the initial resistance Ri is lower than the target resistance state Rt, and may provide a result of determination to the control logic unit 13A as the pass/fail signal P/F. In another embodiment, the read circuit 122A may determine whether the initial resistance Ri is higher than the target resistance state Rt, and may provide a result of determination to the control logic unit 13A as the pass/fail signal P/F.

The write mode determiner 131 may generate the write mode signal WMD that activates the first write circuit 1211 or the second write circuit 1212 in accordance with the pass/fail signal P/F, and may provide the generated write mode signal WMD to the write circuit 121A. In this regard, the write mode signal WMD may instruct the first write mode to activate the first write circuit 1211 and the second write mode to activate the second write circuit 1212. In an exemplary embodiment, the first write mode may correspond to a logic "high" level, and the second write mode may correspond to a logic "low" level. In another embodiment, the first write mode may correspond to the logic "low" level, and the second write mode may correspond to the logic "high" level.

When the initial resistance Ri is higher than the target resistance state Rt, since the write operation needs to be performed in a direction in which resistance is reduced, i.e. in a set direction, the write mode determiner 131 may generate the write mode signal WMD that instructs the first write mode. Conversely, when the initial resistance Ri is lower than the target resistance state Rt, since the write operation needs to be performed in a direction in which resistance increases, i.e. in a reset direction, the write mode determiner 131 may generate the write mode signal WMD that instructs the second write mode.

Operation of the read circuit 122A and the write mode determiner 131 when the verify write operation is performed will now be described. After performing the write operation on the memory cell MC, the read circuit 122A may perform the verify read operation of reading a current status of the memory cell MC. In more detail, the read circuit 122A may determine whether the current resistance of the memory cell MC is included in the target resistance state Rt with respect to data that is to be written. In this regard, the target resistance state Rt may correspond to a range between the first reference resistance (for example, $R_L$ of FIG. 9) and the second reference resistance (for example, $R_U$ of FIG. 9) that is higher than the first reference resistance. Hereinafter, for convenience of description, an example in which the target resistance state Rt is the first resistance state RS1 of FIG. 9, the first reference resistance is $R_L$ of FIG. 9, and the second reference resistance is $R_U$ of FIG. 9 will be described.

In the present embodiment, the read circuit 122A may perform a bidirectional verify read operation on the memory cell MC. In more detail, the read circuit 122A may perform a first direction verify read operation of determining whether a current resistance of the memory cell MC is lower than the second reference resistance $R_U$. In this regard, when the current resistance of the memory cell MC is lower than the second reference resistance $R_U$, the read circuit 122A may output the pass signal P indicating that a program has been completed, and when the current resistance of the memory cell MC is higher than the second reference resistance $R_U$, the read circuit 122A may output the fail signal F indicating that the program has not been completed.

In an exemplary embodiment, when the read circuit 122A generates the pass signal P as a result of performing the first direction verify read operation, the control logic unit 13A may inactivate the operation control signal CTRL_op and the voltage control signal CTRL_vol based on the pass signal P. In another embodiment, when the read circuit 122A generates the pass signal P as the result of performing the first direction verify read operation, the control logic unit 13A may activate the operation control signal CTRL_op and the voltage control signal CTRL_vol such that the read circuit 122A may perform a second direction verify read operation.

When the read circuit 122A generates the pass signal P as the result of performing the first direction verify read operation, the write circuit 121A may stop performing the write operation on the memory cell MC based on the pass signal P irrespective of the input data DATA, and may not provide a write pulse to the memory cell MC.

Conversely, when the read circuit 122A generates the fail signal F as the result of performing the first direction verify read operation, the control logic unit 13A may activate the operation control signal CTRL_op and the voltage control signal CTRL_vol based on the fail signal F. In more detail, the control logic unit 13A may control the voltage control signal CTRL_vol such that size of the write pulse to be provided to the memory cell MC may increase.

The control logic unit 13A may generate the write mode signal WMD that instructs the second write mode to program the memory cell MC in the set direction. Accordingly, the second write circuit 1212 may be activated in accordance with the write mode signal WMD, thus providing a verify write current pulse to the memory cell MC, thereby performing the verify write operation.

The read circuit 122A may perform a second direction verify read operation of determining whether the current resistance of the memory cell MC is higher than the first reference resistance $R_L$. In this regard, when the current resistance of the memory cell MC is higher than the first reference resistance $R_L$, the read circuit 122A may output the pass signal P indicating that the program has been completed, and when the current resistance of the memory cell MC is lower than the first reference resistance $R_L$, the read circuit 122A may output the fail signal F indicating that the program has not been completed.

In an exemplary embodiment, when the read circuit 122A generates the pass signal P as a result of performing the second direction verify read operation, the control logic unit 13A may inactivate the operation control signal CTRL_op and the voltage control signal CTRL_vol based on the pass signal P. In another embodiment, when the read circuit 122A generates the pass signal P as the result of performing the second direction verify read operation, the control logic unit 13A may activate the operation control signal CTRL_op and the voltage control signal CTRL_vol such that the read circuit 122A may perform the first direction verify read operation.

When the read circuit 122A generates the pass signal P as the result of performing the second direction verify read operation, the write circuit 121A may stop performing the write operation on the memory cell MC based on the pass signal P irrespective of the input data DATA, and may not provide the write pulse to the memory cell MC.

Conversely, when the read circuit 122A generates the fail signal F as the result of performing the second direction verify read operation, the control logic unit 13A may activate the operation control signal CTRL_op and the voltage control signal CTRL_vol based on the fail signal F. In more detail, the control logic unit 13A may control the voltage control signal CTRL_vol such that size of the write pulse that is to be provided to the memory cell MC may increase.

The control logic unit 13A may generate the write mode signal WMD that instructs the first write mode to program the memory cell MC in the reset direction. Accordingly, the first write circuit 1211 may be activated in accordance with the write mode signal WMD, thus providing the verify write current pulse to the memory cell MC, thereby performing the verify write operation.

Figure 12:
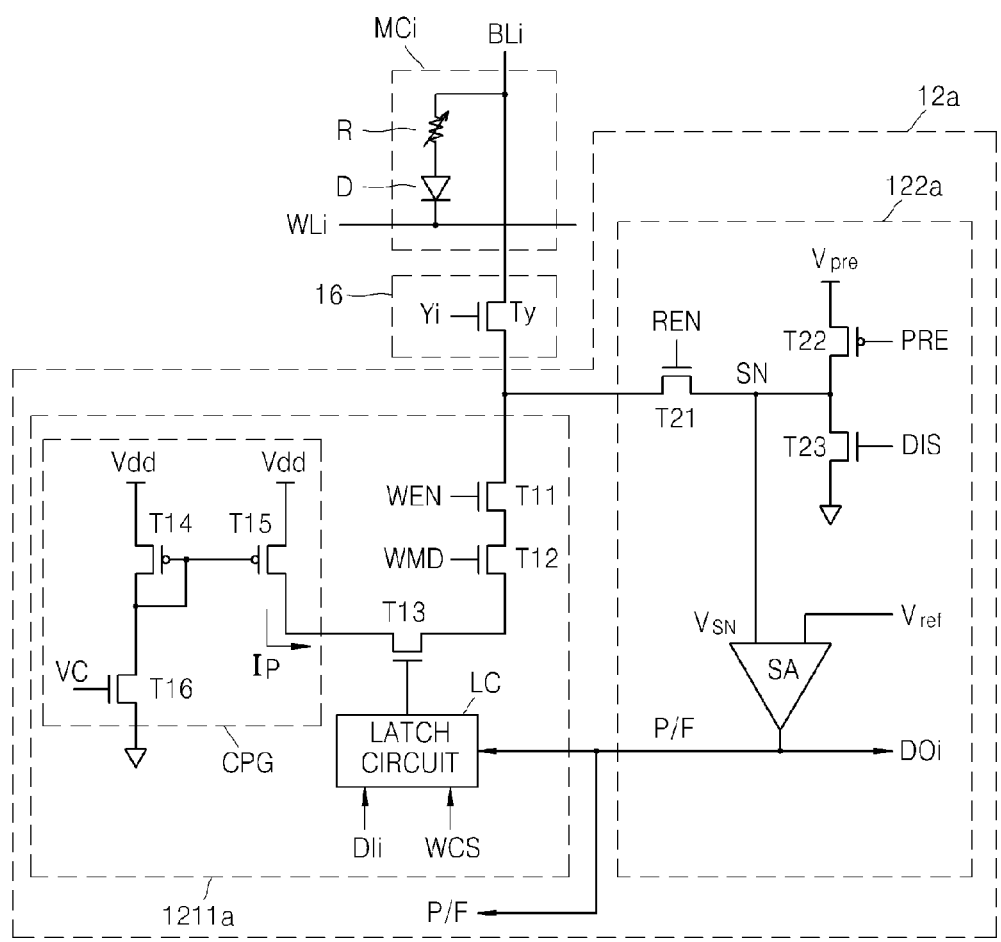
FIG. 12 is a circuit diagram of an example of a first write circuit and an example of a read circuit of FIG. 11.

FIG. 12 is a circuit diagram of an example of a first write circuit 1211a and an example of a read circuit 122a of FIG. 11. Referring to FIG. 12, a memory cell MCi may be disposed in an area in which a bit line BLi and a word line WLi cross each other, and may include the variable resistance device R and the selection device D. The column decoder 16 may include a bit line selection transistor Ty. The bit line selection transistor Ty may connect the memory cell MCi and the write/read circuit 12a in response to a column address signal Yi. The case where the column address signal Yi is activated and the memory cell MCi and the write/read circuit 12a are connected to each other will now be described.

The first write circuit 1211*a* may include first through third transistors T11, T12, and T13, a current pulse provider CPG, and a latch circuit LC. In the present embodiment, if the write enable signal WEN is activated, the first transistor T11 is turned on, and, if the write mode signal WMD is activated (i.e. a first write mode is instructed), the second transistor T12 is turned on, and thus the first write circuit 1211*a* may be connected to the memory cell MCi.

The current pulse provider CPG may include fourth through sixth transistors T14, T15, and T16. The fourth and fifth transistors T14 and T15 may constitute a current mirror. The sixth transistor T16 may provide a current pulse Ip in response to the control voltage VC applied to a gate of the sixth transistor T16. The first write circuit 1211*a* may provide the current pulse Ip to the memory cell MCi.

In an exemplary embodiment, the current pulse Ip may be a write current pulse, and the memory cell MCi may perform a write operation in a set direction in accordance with a write current pulse. In another embodiment, the current pulse Ip may be a verify write current pulse, and the memory cell MCi may perform a verify write operation in the set direction in accordance with the verify write current pulse.

The latch circuit LC may output a gate voltage such that the third transistor T13 may be selectively turned on in accordance with a logic level of an input bit DIi in response to the write control signal WCS. In an exemplary embodiment, when the write control signal WCS instructs the write operation in the set direction, the latch circuit LC may turn on the third transistor T13 if a logic level of the input bit DIi is "0", and may turn off the third transistor T13 if the logic level of the input bit DIi is "1". In another embodiment, when the write control signal WCS instructs the write operation in a reset direction, the latch circuit LC may turn off the third transistor T13 if the logic level of the input bit DIi is "0", and may turn on the third transistor T13 if the logic level of the input bit DIi is "1".

The read circuit 122*a* may include the first through third transistors T21, T22, and T23 and a sense amplifier SA. In the present embodiment, if the read enable signal REN is activated, the first transistor T21 is turned on, and thus the read circuit 122*a* may be connected to the memory cell MCi.

If a precharge signal PRE is activated, the second transistor T12 may be turned on, and the bit line BLi may be precharged with a precharge voltage Vpre. If a discharge signal DIS is activated, the third transistor T13 may be turned on, and the bit line BLi may be initialized with a ground voltage.

The sense amplifier SA may be activated in accordance with a sense enable signal SEN, may compare a voltage $V_{SN}$ of a sensing node SN with a reference voltage Vref, and may provide an output bit BOi indicating that the memory cell MCi is in an on state or an off state. In a general read operation, the output bit DOi may be provided to an element outside the memory device 10A, for example the memory controller 20. To determine whether a write operation has been completed, in a verify read operation the output bit DOi may be provided to element(s) inside of the memory device 10A, for example the latch circuit LC and the control logic unit 13*a*, as the pass/fail signal P/F indicating whether the write operation has succeeded or failed.

The control logic unit 13*a* may control the voltage control signal CTRL_vol and may increase size of the control voltage VC when the pass/fail signal P/F indicates that the write operation has not been completed. If the size of the control voltage VC increases, size of the current pulse Ip provided to the memory cell MCi may increase. In an exemplary embodiment, in accordance with the increase in the control voltage VC, amplitude of the current pulse Ip may increase. In another embodiment, in accordance with the increase in the control voltage VC, width of the current pulse Ip may increase. In another embodiment, in accordance with the increase in the control voltage VC, the amplitude and the width of the current pulse Ip may increase.

The latch circuit LC may turn off the third transistor T13 irrespective of the input bit DIi to stop performing the write operation on the memory cell MCi when the pass/fail signal P/F indicates that the write operation has been completed.

Figure 13:
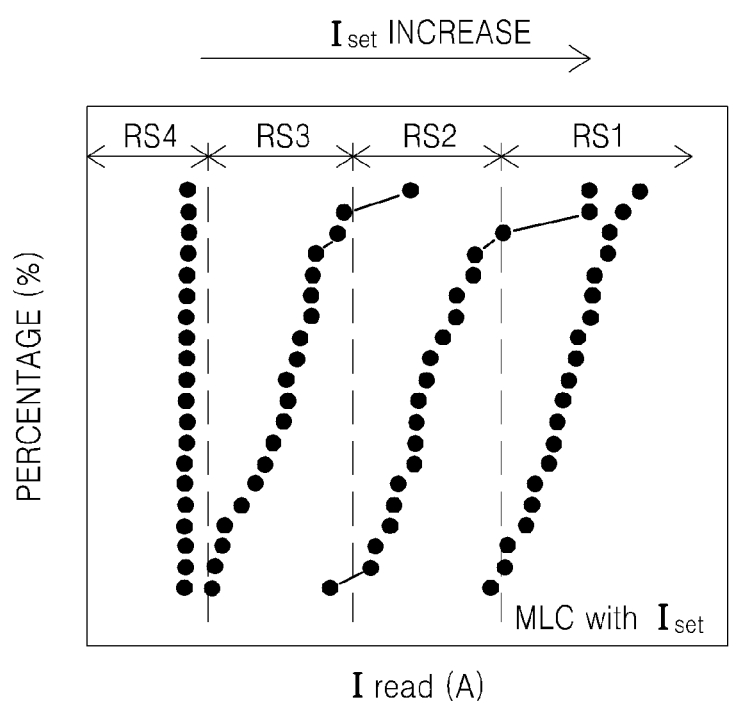
FIG. 13 is a graph showing a distribution of memory cells with respect to a write operation of the first write circuit of FIG. 12.

FIG. 13 is a graph showing a distribution of the memory cells MC with respect to a write operation of the first write circuit 1211*a* of FIG. 12. Referring to FIG. 13, the horizontal axis represents read current Iread, and the vertical axis represents accumulated distribution percentage. The set current pulse Iset, i.e. a write current pulse or a verify write current pulse, is applied to the memory cells MC having the fourth resistance state RS4 in a high resistance state or a reset state, and thus the read current Iread may increase, and a write operation in a set direction in which resistance is reduced may be performed. In this regard, in accordance with an increase in the set current pulse Iset, the read current Iread may increase, and the resistance may decrease.

Figure 14:
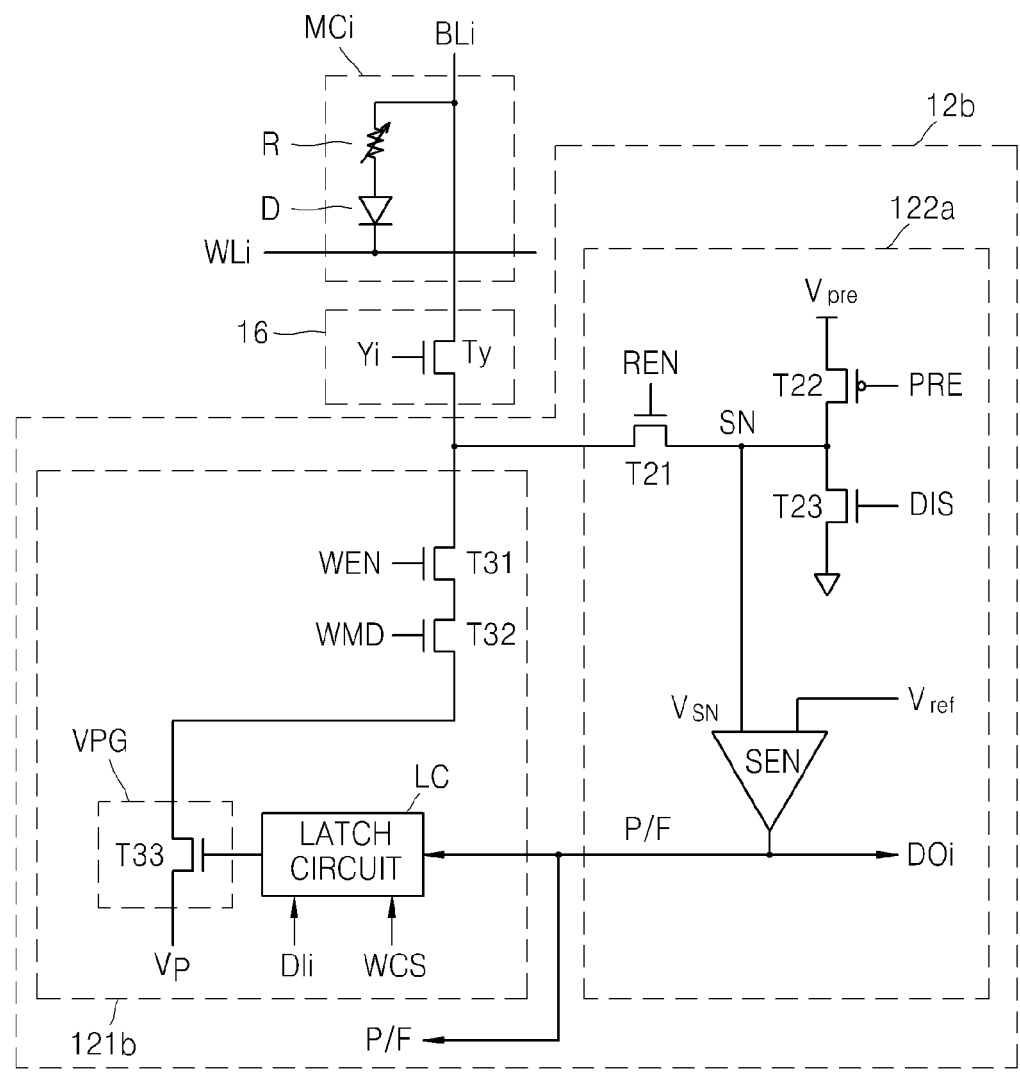
FIG. 14 is a circuit diagram of an example of a second write circuit and an example of the read circuit of FIG. 11.

FIG. 14 is a circuit diagram of an example of a second write circuit 1212*a* and an example of a read circuit 122*a* of FIG. 11. Referring to FIG. 14, configurations and operations of the memory cell MCi, the column decoder 16, and the read circuit 122*a* are substantially the same as those of the corresponding elements of FIG. 11, and thus detailed descriptions thereof are omitted.

The second write circuit 1212*a* may include first and second transistors T31 and T32, a voltage pulse provider VPG, and the latch circuit LC. In the present embodiment, if the write enable signal WEN is activated, the first transistor T31 is turned on, and if the write mode signal WMD is inactivated (i.e., if a second write mode is instructed), the second transistor T32 is turned on, and thus the third write circuit 1212*a* may be connected to the memory cell MCi.

The voltage pulse provider VPG may include a third transistor T33. The third transistor T33 may provide a voltage pulse Vp in response to an output of the latch circuit LC applied to a gate of the third transistor T33. Thus, the second write circuit 1212*a* may provide the voltage pulse Vp to the memory cell MCi.

In an exemplary embodiment, the voltage pulse Vp may be a write voltage pulse, and the memory cell MCi may perform a write operation in a reset direction in accordance with a write voltage pulse. In another embodiment, the voltage pulse Vp may be a verify write voltage pulse, and the memory cell MCi may perform a verify write operation in the reset direction in accordance with the verify write voltage pulse.

The latch circuit LC may output a gate voltage such that the third transistor T33 may be selectively turned on in accordance with a logic level of the input bit DIi in response to the write control signal WCS. In an exemplary embodiment, when the write control signal WCS instructs the write operation in the set direction, the latch circuit LC may turn on the third transistor T33 if a logic level of the input bit DIi is "0", and may turn off the third transistor T33 if the logic level of the input bit DIi is "1". In another embodiment, when the write control signal WCS instructs the write operation in a reset direction, the latch circuit LC may turn off the third transistor T33 if the logic level of the input bit DIi is "0", and may turn on the third transistor T33 if the logic level of the input bit DIi is "1".

Figure 15:
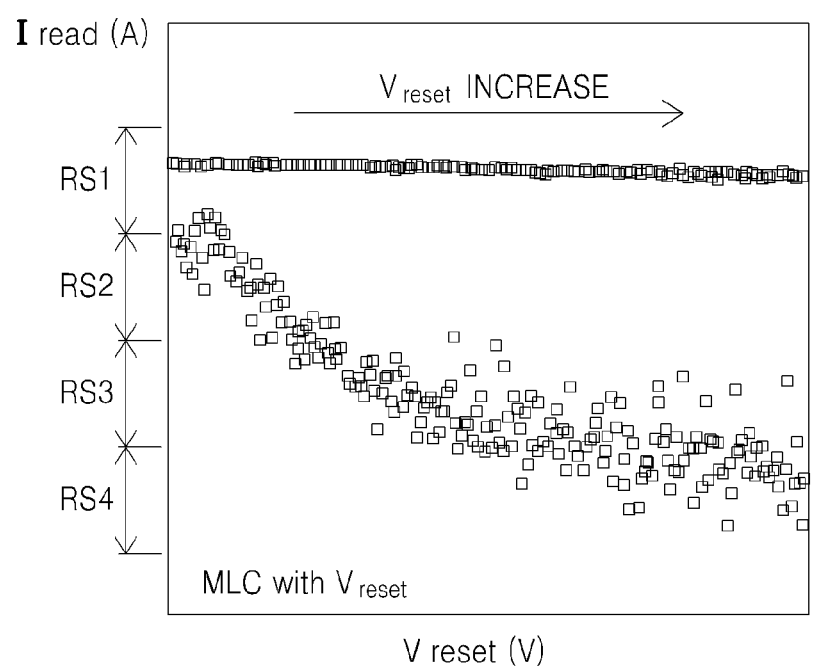
FIG. 15 is a graph showing a distribution of memory cells with respect to a write operation of the second write circuit of FIG. 14.

FIG. 15 is a graph showing a distribution of the memory cells MC with respect to a write operation of the second write circuit 1212a of FIG. 14. Referring to FIG. 15, the horizontal axis represents reset voltage Vreset, and the vertical axis represents read current head. A write voltage pulse corresponding to the reset voltage Vreset, i.e., a write voltage pulse or a verify write voltage pulse, is applied to the memory cells MC having the first resistance state RS1 in a low resistance state or a set state, and thus the read current Iread may be reduced, and a write operation in a reset direction in which resistance increases may be performed. In this regard, when the reset voltage Vreset increases, the read current Iread is reduced, and the resistance increases.

Figure 16:
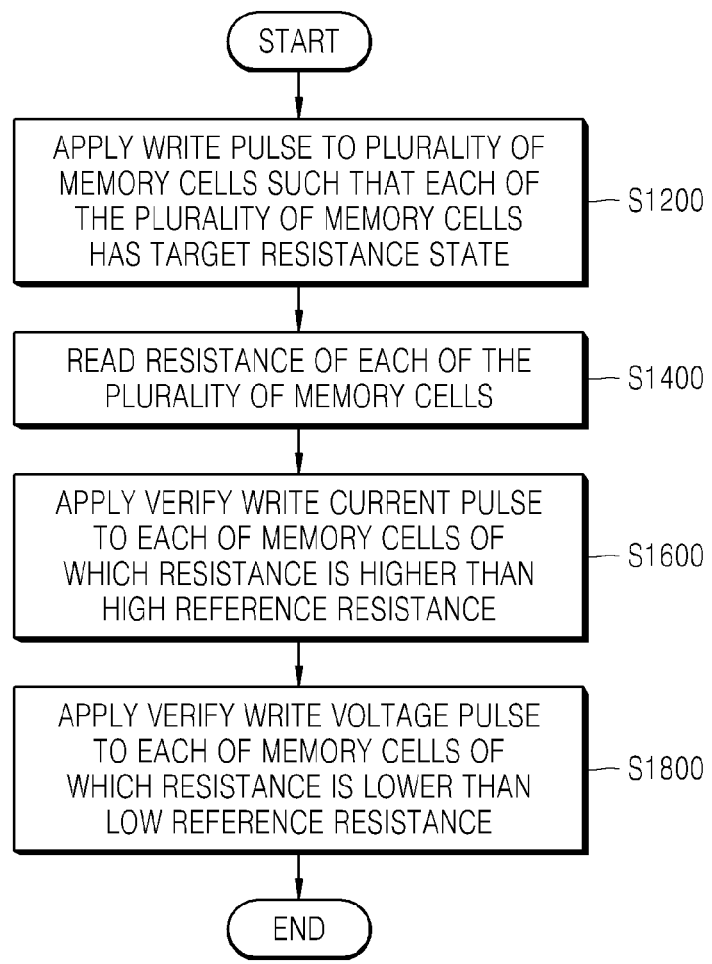
FIG. 16 is a flowchart of a method of operating a memory device in accordance with an embodiment of the inventive concept.

FIG. 16 is a flowchart of a method of operating a memory device, in accordance with an embodiment of the inventive concept, to write data to a plurality of memory cells included in a memory cell array included in the memory device. Thus, the descriptions provided above with reference to FIGS. 1 through 15 may apply to the method of operating the memory device in accordance with the present embodiment. The method of operating the memory device in accordance with the present embodiment will now be described with reference to FIGS. 1 through 16 below.

A write pulse is applied (S1200) to the plurality of memory cells so that each of the plurality of memory cells may have a target resistance state. In this regard, the target resistance state may be a resistance state with respect to data that is to be written, and may correspond to a range between a first reference resistance and a second reference resistance. The second reference resistance may be greater than the first reference resistance, and thus the first reference resistance may refer to a low reference resistance, and the second reference resistance may refer to a high reference resistance. For example, the target resistance state is the first resistance state RS1 of FIG. 9, the first reference resistance is $R_L$ of FIG. 9, and the second reference resistance is $R_U$ of FIG. 9.

A verify pulse is applied to the plurality of memory cells to read (S1400) current resistance of the plurality of memory cells to determine whether a program has been completed in the plurality of memory cells, and may refer to a verify read operation. For example, the verify pulse may be a voltage pulse, and amplitude of the verify pulse may be lower than that of the write pulse.

A verify write current pulse is then applied (S1600) to each of memory cells of which resistance is higher than the high reference resistance. In more detail, the control logic unit 13 may generate the write mode signal WMD indicating a first write mode, and the first write circuit 1211 may be activated in accordance with the write mode signal WMD. The first write circuit 1211 may apply the verify write current pulse to the memory cells.

A verify write voltage pulse is then applied (S1800) to each memory cell that has resistance lower than the lower reference resistance. In more detail, the control logic unit 13 may generate the write mode signal WMD indicating a second write mode, and the second write circuit 1212 may be activated in accordance with the write mode signal WMD. The second write circuit 1212 may apply the verify write voltage pulse to the memory cells.

Figure 17:
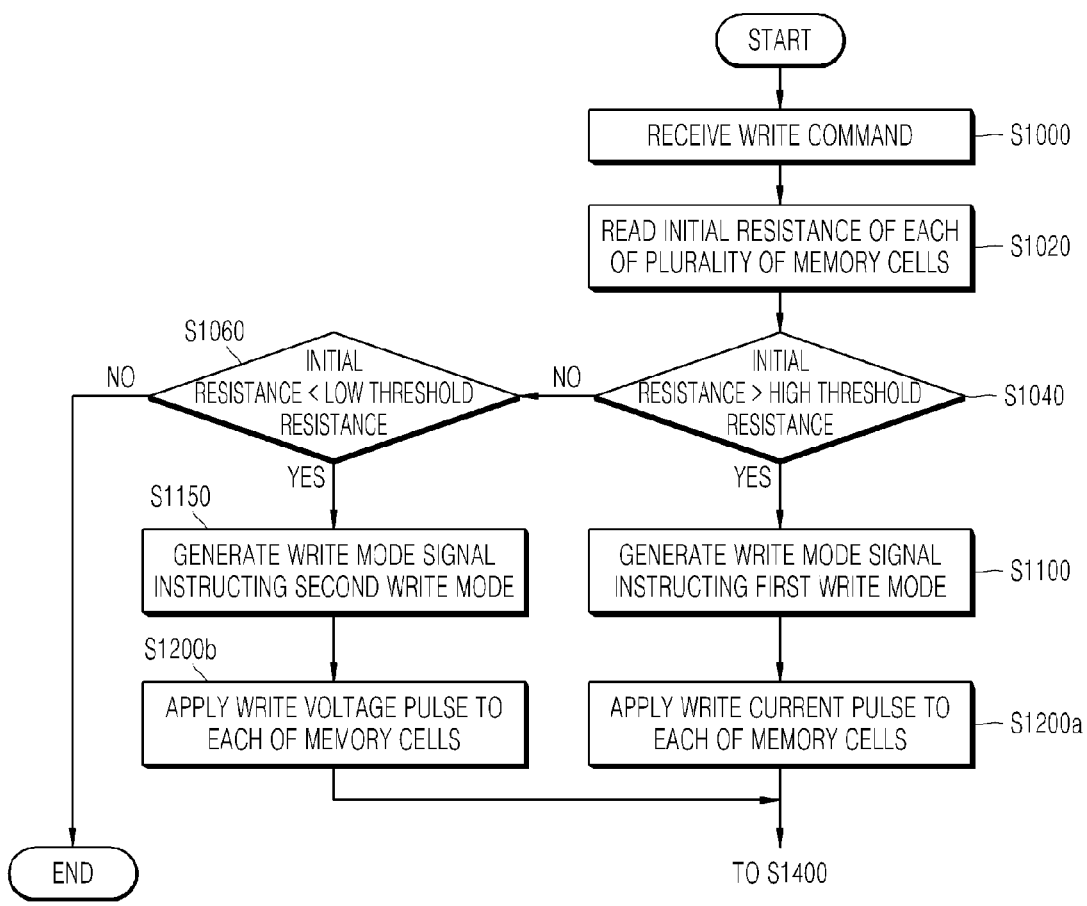
FIG. 17 is a flowchart of a method of operating a memory device in accordance with another embodiment of the inventive concept.

FIG. 17 is a flowchart of a method of operating a memory device in accordance with another embodiment of the inventive concept. Referring to FIG. 17, the method may further include operations S1000 through S1150 performed before operation S1200 of FIG. 16, and operation S1200 of FIG. 16 may be changed to operations S1200a and S1200b. The method may be performed in the same manner as the method of FIG. 16 after operation S1200. Accordingly, redundant descriptions of steps common to FIGS. 16 and 17 are omitted.

Referring to FIG. 17, a write command is received (S1000). In more detail, the control logic unit 13 may receive the write command from the memory controller 20.

The initial resistance Ri of each memory cell is then read (S1020). In more detail, the read circuit 122 may read the initial resistance Ri of the plurality of memory cells before applying a write pulse.

It is then determined (S1040) whether the initial resistance Ri is higher than a high threshold resistance. For example, the read circuit 122 may determine whether the initial resistance Ri is higher than the high threshold resistance by comparing the reference voltage Vref corresponding to the high threshold resistance with the voltage $V_{SN}$ of the sensing node SN connected to the memory cells. As a result of this determination (S1040), if the initial resistance Ri is higher than the high threshold resistance, then a write mode signal is generated (S1100) instructing first write mode. In more detail, the write mode determiner 131 included in the control logic unit 13 may generate the write mode signal WMD instructing the first write mode. For example, the write mode determiner 131 may activate the write mode signal WMD and determine the write mode signal WMD as a logic "high" level. Then a write current pulse is applied (S1200a) to each of the plurality of memory cells. In more detail, the first write circuit 1211 may be activated in response to the activated write mode signal WMD, and may provide the write current pulse to the memory cells, thereby performing a write operation on the memory cells.

Conversely, if the initial resistance Ri is not higher than the high threshold resistance, it is determined (S1060) whether the initial resistance Ri is lower than a low threshold resistance. For example, the read circuit 122 may determine whether the initial resistance Ri is lower than the low threshold resistance by comparing the reference voltage Vref corresponding to the low threshold resistance with the voltage $V_{SN}$ of the sensing node SN connected to the memory cells. As a result of this determination(S1060), if the initial resistance Ri is lower than the low threshold resistance then a write mode signal is generated (S1150) instructing the second write mode. In more detail, the write mode determiner 131 included in the control logic unit 13 may generate the write mode signal WMD instructing the second write mode. For example, the write mode determiner 131 may inactivate the write mode signal WMD and determine the write mode signal WMD as a logic "low" level. Then a write voltage pulse is applied (S1200b) to each of the plurality of memory cells. In more detail, the second write circuit 1212 may be activated in response to the inactivated write mode signal WMD, and may provide the write voltage pulse to the memory cells, thereby performing the write operation on the memory cells.

Conversely, if the initial resistance Ri is not lower than the low threshold resistance at this point, it is determined that the memory cell is in a resistance state with respect to data that is to be written, and the write operation on the memory cell may end.

Figure 18A:
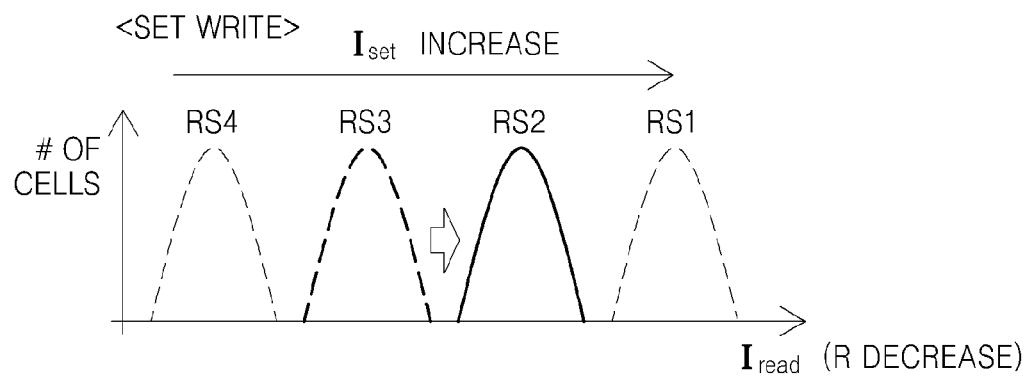
FIGS. 18A and FIG. 18B are graphs showing examples of a set operation (S1200a) and a reset operation (S1200b), respectively, in accordance with applying a write current pulse to a plurality of memory cells while utilizing the method of FIG. 17.
Figure 18B:
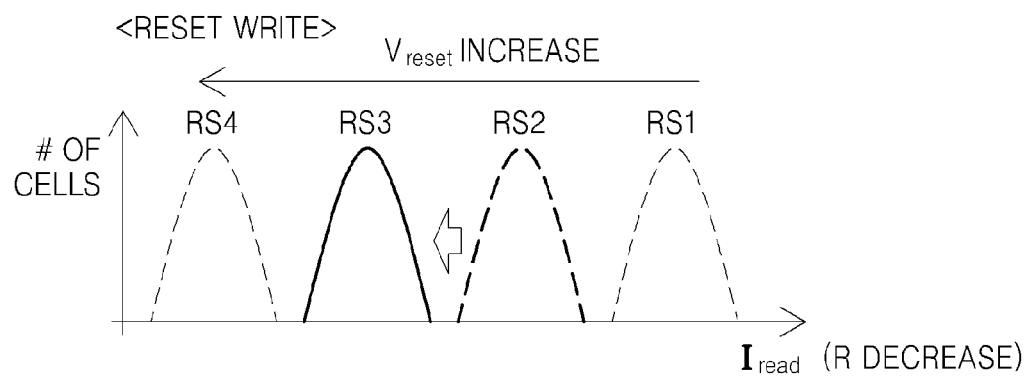

FIG. 18A is a graph showing an example of the set write operation (S1200a) of FIG. 17, and FIG. 18B is a graph showing an example of the reset write operation (S1200b) of FIG. 17.

Referring to FIG. 18A, the horizontal axis represents read current Iread, and the vertical axis represents number of memory cells. In accordance with the present embodiment, when a write operation is performed in a direction in which resistance is reduced, i.e. in a set direction, the write current pulse Iset may be provided to the memory cells. The more the write current pulse Iset increases, the more the read current Iread may increase, and the more the resistance of the memory cells may decrease.

Referring to FIG. 18B, the horizontal axis represents read current Iread, and the vertical axis represents number of memory cells. In accordance with the present embodiment, when a write operation is performed in a direction in which resistance increases, i.e. in a reset direction, the write voltage pulse Ireset may be provided to the memory cells. The more the write voltage pulse Ireset increases, the more the read current Iread may decrease, and the more the resistance of the memory cells may increase.

Figure 19:
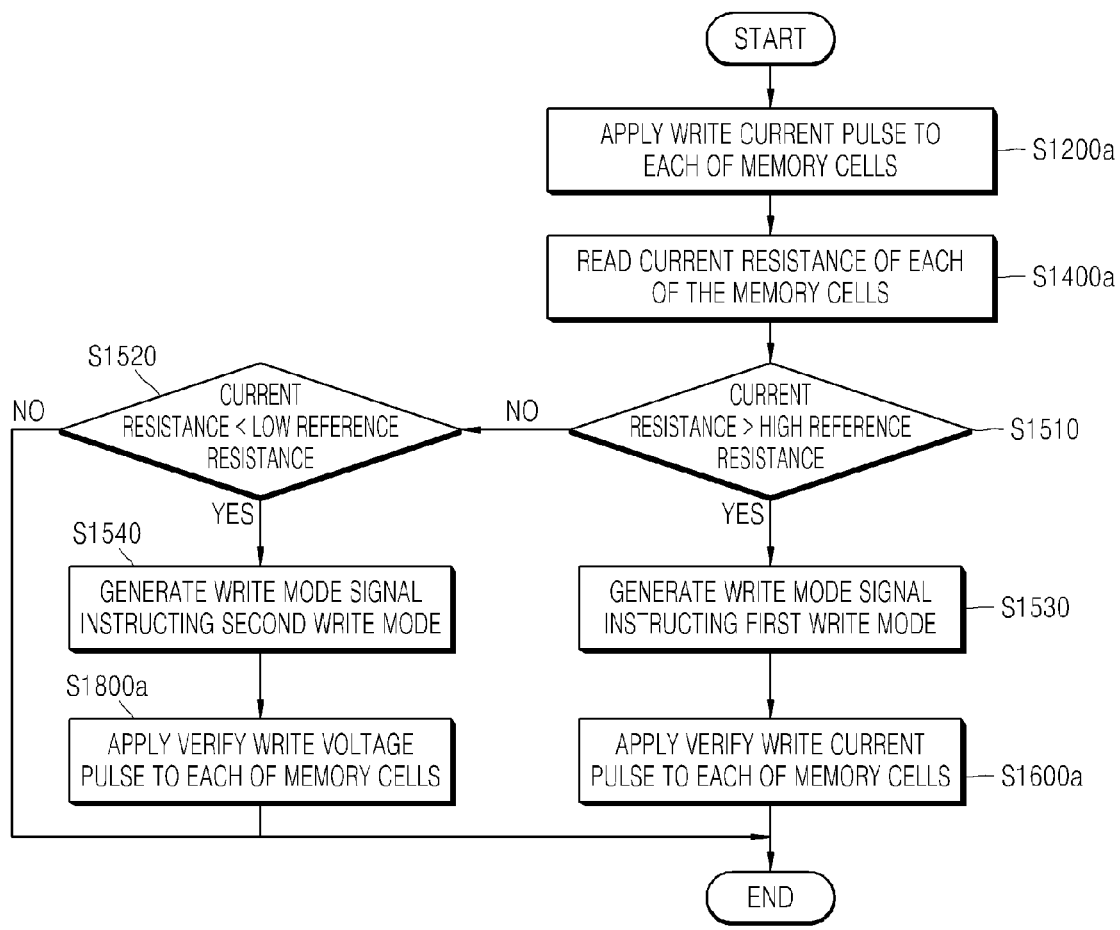
FIG. 19 is a flowchart of a method of operating a memory device, in accordance with another embodiment of the inventive concept.

FIG. 19 is a flowchart of a method of operating a memory device in accordance with another embodiment of the inventive concept in which additional operations (S1400 through S1800) are performed after operation a write current pulse is applied (S1200a of FIG. 17) to each of the memory cells. Redundant descriptions of steps common to FIGS. 17 and 19 will be omitted.

With reference to FIG. 19, a current pulse (for example, Iset0 of FIGS. 20A through 20C) is applied (S1200a) to each of a plurality of memory cells so that the plurality of memory cells may have a target resistance state. A current resistance of each of the plurality of memory cells is then read (S1400a) by applying a verify pulse (for example, Vread of FIGS. 20A through 20C) to the plurality of memory cells.

It is then determined (S1510) whether the current resistance is higher than a high reference resistance. This may refer to a verify read operation in a first direction. For example, the read circuit 122 may determine whether the current resistance is higher than the high reference resistance by comparing the reference voltage Vref corresponding to the high reference resistance with a voltage of the sensing node $V_{SN}$ connected to the memory cells.

As a result of this determination, if the current resistance is higher than the high reference resistance, then a write mode signal instructing a first write mode is generated (S1530). In more detail, the write mode determiner 131 included in the control logic unit 13 may generate the write mode signal WMD instructing the first write mode. For example, the write mode determiner 131 may activate the write mode signal WMD and may determine the write mode signal WMD as a logic "high" level.

Then a verify write current pulse (for example, Iset1 of FIGS. 20A through 20C) is applied (S1600a) to each of the plurality of memory cells. In more detail, the first write circuit 1211 may be activated in response to the activated write mode signal WMD, and may provide the verify write current pulse to the memory cells, thereby performing a verify write operation on the memory cells. In this regard, the verify write current pulse (for example, Iset1 of FIGS. 20A through 20C) may be greater than the write current pulse (for example, Iset0 of FIGS. 20A through 20C).

Conversely, if it is determined (S1510) that the current resistance is not higher than the high reference resistance, then a determination is made (S1520) as to whether the current resistance is lower than a low reference resistance. This may refer to a verify read operation in a second direction. For example, the read circuit 122 may determine whether the current resistance is lower than the low reference resistance by comparing the reference voltage Vref corresponding to the high reference resistance with the voltage of the sensing node $V_{SN}$ connected to the memory cells. As a result of this determination (S1520), if the current resistance is not lower than the low reference resistance, it may be determined that a write operation on the memory cells is completed, and the write operation may end. For example, the read circuit 122 may generate the pass signal P that may be provided to the write circuit 121 and the control logic unit 13.

However, if it is determined (S1520) that the current resistance is lower than the low reference resistance, then a write mode signal instructing a second write mode is generated (S1540). In more detail, the write mode determiner 131 included in the control logic unit 13 may generate the write mode signal WMD instructing the second write mode. For example, the write mode determiner 131 may inactivate the write mode signal WMD and determine the write mode signal WMD as a logic "low" level.

Then the verify write voltage pulse is applied (S1800a) to each of the plurality of memory cells. In more detail, the second write circuit 1212 may be activated in response to the inactivated write mode signal WMD, and may provide the verify write voltage pulse to the memory cells, thereby performing the verify write operation on the memory cells.

In an exemplary embodiment, operation S1400 may be performed after operations S1600 and S1800. In more detail, a verify pulse is applied to the plurality of memory cells to which the verify write current pulse or the verify write voltage pulse is applied, and thus a verify read operation of reading the current resistance of the plurality of memory cells may be performed again.

Figure 20A:
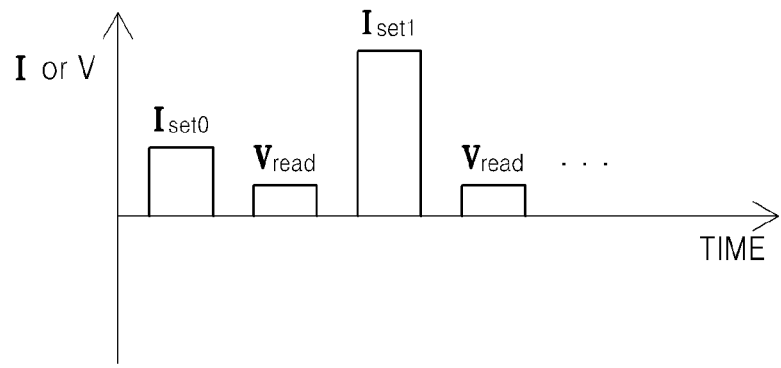
FIGS. 20A through 20C are graphs showing examples of electrical pulses applied to memory cells in the method of FIG. 19.
Figure 20B:
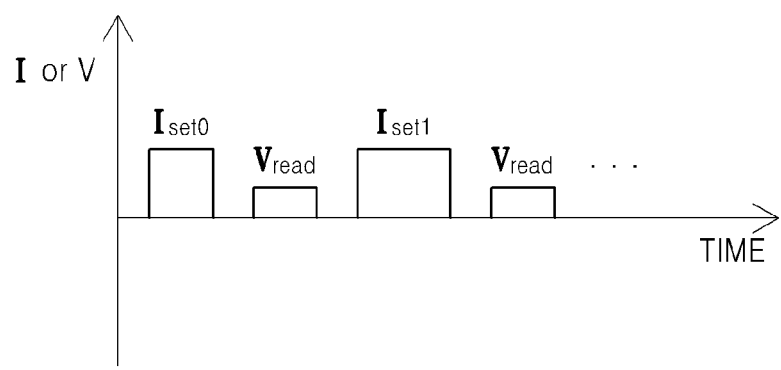
Figure 20C:
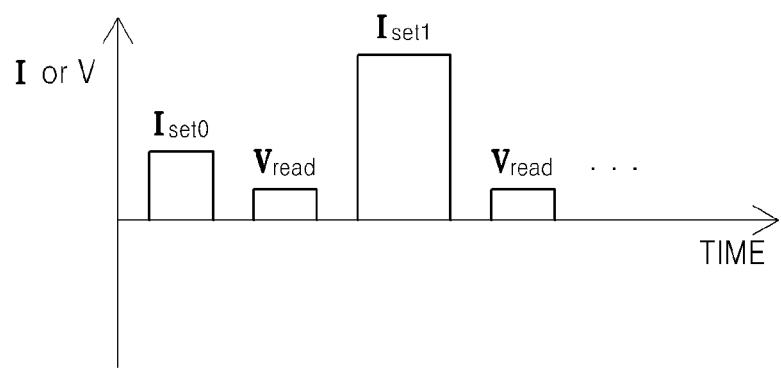

FIGS. 20A through 20C are graphs showing examples of electrical pulses applied to the memory cells MC of an operation of FIG. 19. Referring to FIGS. 20A through 20C, the horizontal axis represents time, and the vertical axis represents amplitudes of the electrical pulses. In an embodiment of FIG. 20A, a second amplitude of the first verify write current pulse Iset1 may be greater than a first amplitude of the write current pulse Iset0. In an embodiment of FIG. 20B, a second width of the first verify write current pulse Iset1 may be greater than a first width of the write current pulse Iset0. In an embodiment of FIG. 20C, the second amplitude and width of the first verify write current pulse Iset1 may be greater than the first amplitude and width of the write current pulse Iset0.

Figure 21:
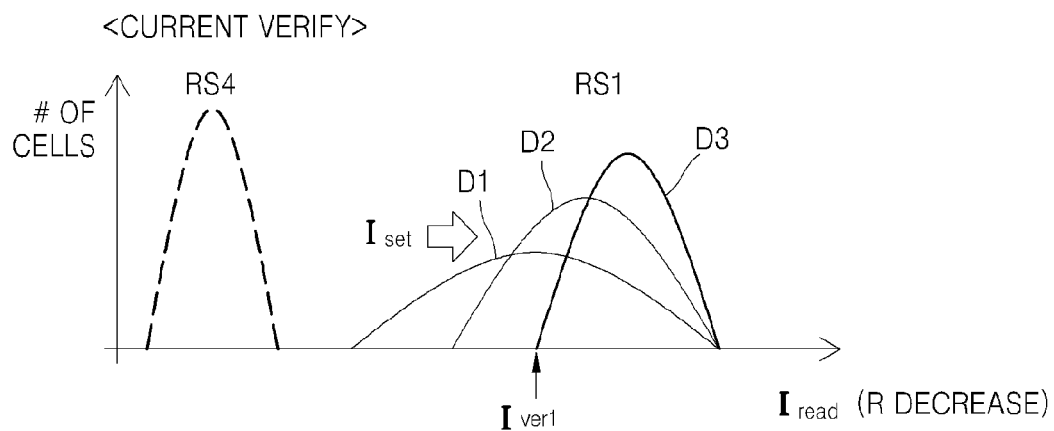
FIG. 21 is a graph showing a verify write operation in accordance with a first direction verify read operation in determining (S1510) whether a current resistance is higher than a high reference resistance in the method of FIG. 19.

FIG. 21 is a graph showing a verify write operation in accordance with a first direction verify read operation S1510 of FIG. 19. Referring to FIG. 21, the horizontal axis represents read current Iread, and the vertical axis represents number of the memory cells MC. In the present embodiment, a current resistance state of the plurality of memory cells MC is the fourth resistance state RS4, and a target resistance state of the plurality of memory cells MC with respect to data that is to be programmed is the first resistance state RS1.

When the write current pulse Iset is applied, resistance of the memory cells MC may be changed from the fourth resistance state RS4 to the first resistance state RS1. In this regard, as a result of performing a first program loop, the distribution of the memory cells MC may be "D1". As a result of performing a second program loop, the distribution of the memory cells MC may be "D2". As a result of performing a third program loop, the distribution of the memory cells MC may be "D3".

In the first program loop, the write current pulse Iset0 may be applied to the plurality of memory cells MC, and then the verify pulse Vread may be applied. In this regard, the control logic unit 13 may control the voltage control signal CTRL_vol such that the first verify write current pulse Iset1 greater than the write current pulse Iset0 may be applied to the memory cells MC that output a read current lower than a first reference read current Iver1 corresponding to a high reference resistance.

In the second program loop, the first verify write current pulse Iset1 may be applied to the plurality of memory cells MC, and then the verify pulse Vread may be applied. In this regard, the control logic unit 13 may control the voltage control signal CTRL_vol such that a second verify write current pulse Iset2 greater than the first verify write current pulse Iset1 may be applied to the memory cells MC that output a read current lower than the first reference read current Iver1.

In the third program loop, the second verify write current pulse Iset2 may be applied to the plurality of memory cells MC, and then the verify pulse Vread may be applied. As a result of performing the third program loop, the plurality of memory cells MC may have a read current greater than the first reference read current Iver1. In accordance with the present embodiment, thereafter, a second direction verify read operation may be performed on the plurality of memory cells MC.

Figure 22:
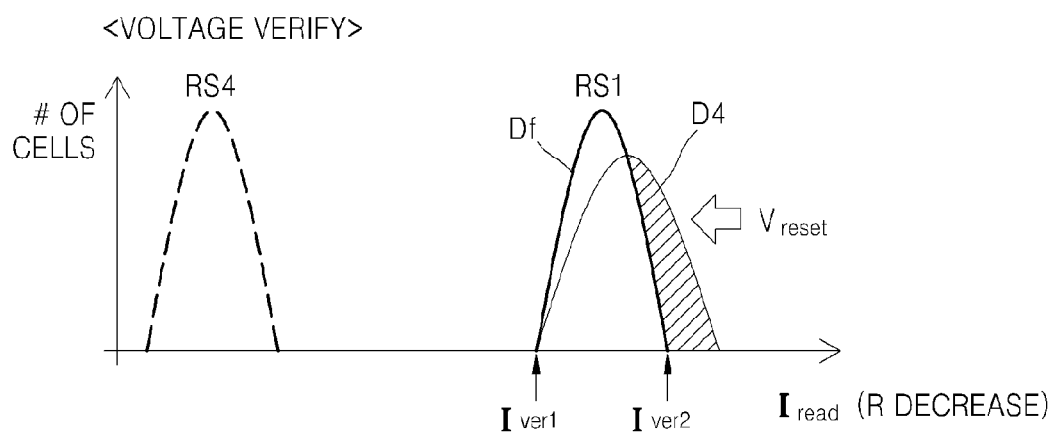
FIG. 22 is a graph showing a verify write operation in accordance with a second direction verify read operation in determining (S1510)whether a current resistance is lower than a low reference resistance in the method of FIG. 19.

FIG. 22 is a graph showing a verify write operation in accordance with a second direction verify read operation S1520 of FIG. 19. Referring to FIG. 22, the horizontal axis represents read current Iread, and the vertical axis represents number of the memory cells MC. In the present embodiment, a current resistance state of the plurality of memory cells MC is the fourth resistance state RS4, and a target resistance state of the plurality of memory cells MC with respect to data that is to be programmed is the first resistance state RS1.

When a write current pulse and a plurality of verify write current pulses are applied, distribution of the memory cells MC may be D4, and final distribution of the memory cells MC may be Df. Some of the memory cells MC corresponding to a slash area in D4 may be over-programmed memory cells. In the present embodiment, the verify write voltage pulse Vreset may be applied to the over-programmed memory cells, and thus the plurality of memory cells MC may have the final distribution Df corresponding to the first resistance state R1 that is to be programmed.

Figure 23:
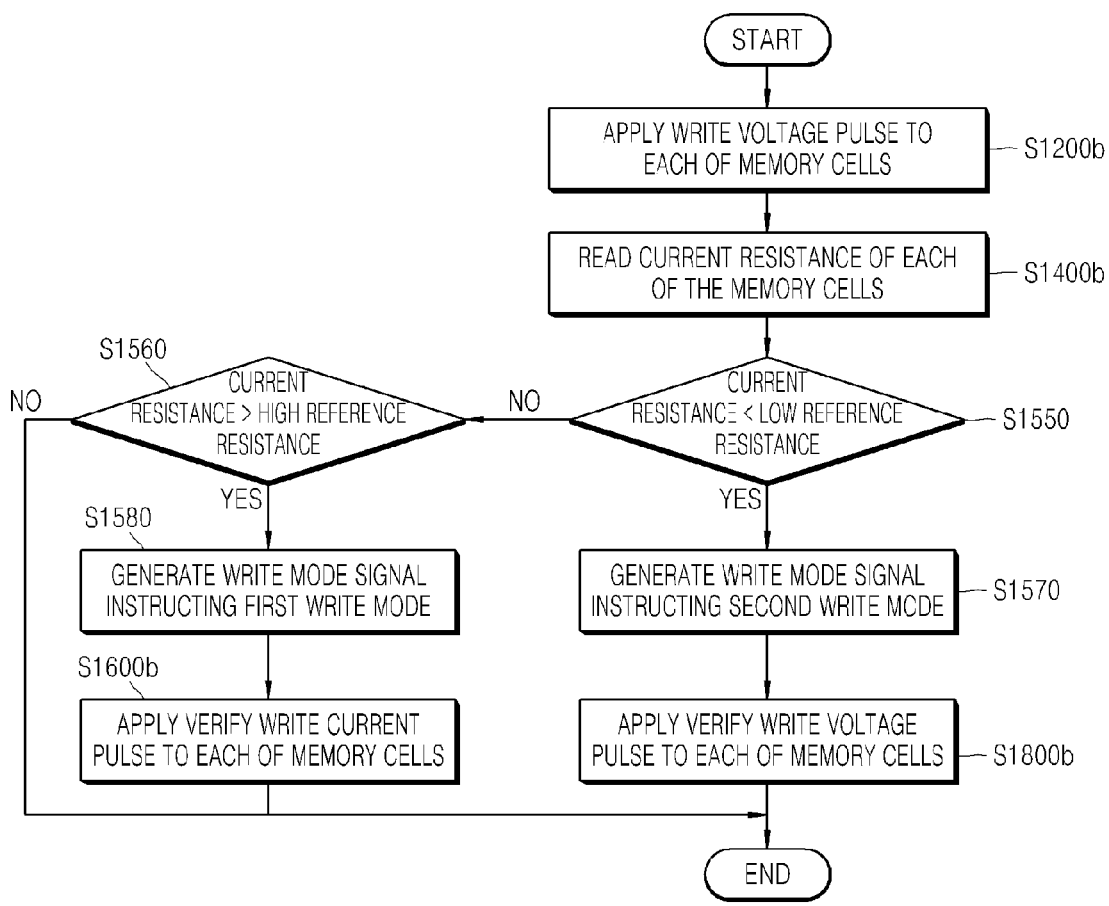
FIG. 23 is a flowchart of a method of operating a memory in accordance with another embodiment of the inventive concept.

FIG. 23 is a flowchart of a method of operating a memory device in accordance with another embodiment of the inventive concept, in which operations S1400 through S1800 are performed after operation S1200b of FIG. 17. Redundant descriptions of steps already described with respect to FIGS. 17 and 19 will be omitted.

A write voltage pulse (for example, Vreset0 of FIGS. 24A through 24C) is applied (S1200b) to a plurality of memory cells. Current resistance of the plurality of memory cells is then read (S1400b) by applying a verify pulse (for example, Vread of FIGS. 24A through 24C) to the plurality of memory cells.

Then it is determined (S1550) whether the current resistance is lower than a low reference resistance. This may refer to a verify read operation in a second direction. For example, the read circuit 122 may determine whether the current resistance is lower than the low reference resistance by comparing the reference voltage Vref corresponding to the low reference resistance with a voltage of the sensing node $V_{SN}$ connected to the memory cells.

As a result of this determination (S1550), if the current resistance is lower than the low reference resistance, a write mode signal instructing a second write mode is generated (S1570). In more detail, the write mode determiner 131 included in the control logic unit 13 may generate the write mode signal WMD instructing the second write mode. For example, the write mode determiner 131 may activate the write mode signal WMD and determine the write mode signal WMD as a logic "low" level.

Then a verify write voltage pulse (for example, Vreset1 of FIGS. 24A through 24C) is applied (S1800b) to each of the plurality of memory cells. In more detail, the second write circuit 1212 may be activated in response to the activated write mode signal WMD, and provide the verify write voltage pulse (for example, Vreset1 of FIGS. 24A through 24C) to the memory cells, thereby performing a verify write operation on the memory cells. In this regard, the verify write voltage pulse (for example, Vreset1 of FIGS. 24A through 24C) may be greater than a write voltage pulse (for example, Vreset0 of FIGS. 24A through 24C).

Conversely, if it is determined (S1550) that the current resistance is not lower than the low reference resistance, a determination is then made (S1560) as to whether the current resistance is higher than a high reference resistance. This may refer to a verify read operation in a first direction. For example, the read circuit 122 may determine whether the current resistance is higher than the high reference resistance by comparing the reference voltage Vref corresponding to the high reference resistance with the voltage of the sensing node $V_{SN}$ connected to the memory cells.

As a result of this determination (S1560), if the current resistance is not higher than the high reference resistance, it may be determined that a write operation on the memory cells is completed, and a write operation may end. For example, the read circuit 122 may generate the pass signal P that may be provided to the write circuit 121 and the control logic unit 13.

Conversely, if the current resistance is higher than the high reference resistance, then a write mode signal instructing the first write mode is generated (S1580). In more detail, the write mode determiner 131 included in the control logic unit 13 may generate the write mode signal WMD instructing the first write mode. For example, the write mode determiner 131 may inactivate the write mode signal WMD and determine the write mode signal WMD as a logic "high" level.

Then a verify write current pulse is applied (S1600b) to each of the plurality of memory cells. In more detail, the first write circuit 1211 may be activated in response to the inactivated write mode signal WMD, and may provide the verify write current pulse to the memory cells, thereby performing the verify write operation on the memory cells.

In an exemplary embodiment, operation S1400 may be performed after operations S1600 and S1800. In more detail, a verify pulse is applied to the plurality of memory cells to which the verify write current pulse or the verify write voltage pulse is applied, and thus a verify read operation of reading the current resistance of the plurality of memory cells may be performed again.

Figure 24A:
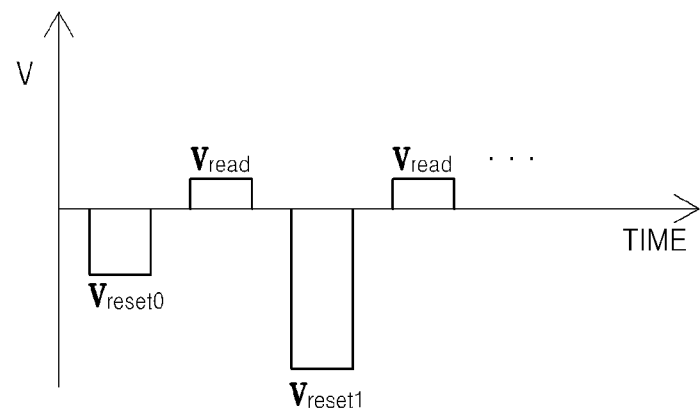
FIGS. 24A through 24C are graphs illustrating examples of electrical pulses applied to memory cells in the method of FIG. 23.
Figure 24B:
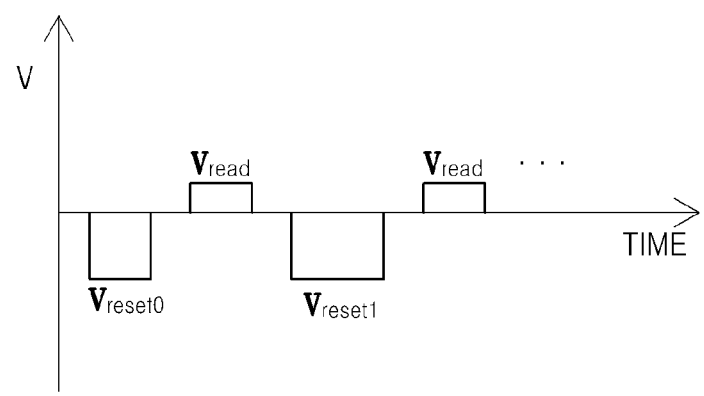
Figure 24C:
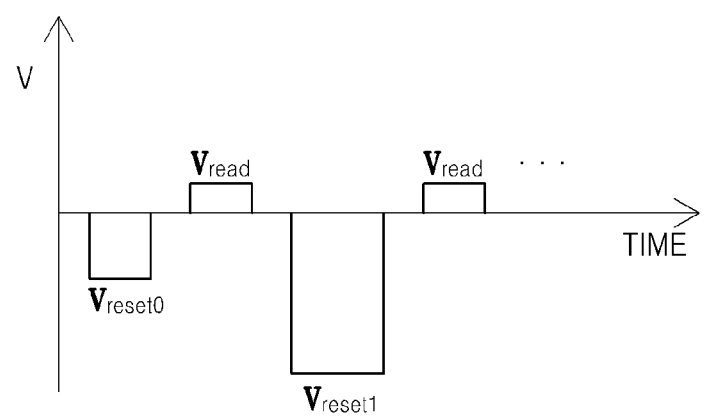

FIGS. 24A through 24C are graphs showing examples of electrical pulses applied to the memory cells MC in the process illustrated in FIG. 23. Referring to FIGS. 24A through 24C, the horizontal axis represents time, and the vertical axis represents amplitudes of the electrical pulses. In an embodiment of FIG. 24A, a second amplitude of the first verify write voltage pulse Vreset1 may be greater than a first amplitude of a write voltage pulse Vreset0. In an embodiment of FIG. 24B, a second width of the first verify write voltage pulse Vreset1 may be greater than a first width of the write voltage pulse Vreset0. In an embodiment of FIG. 24C, the second amplitude and width of the first verify write voltage pulse Vreset1 may be greater than the first amplitude and width of the write voltage pulse Vreset0.

Figure 25:
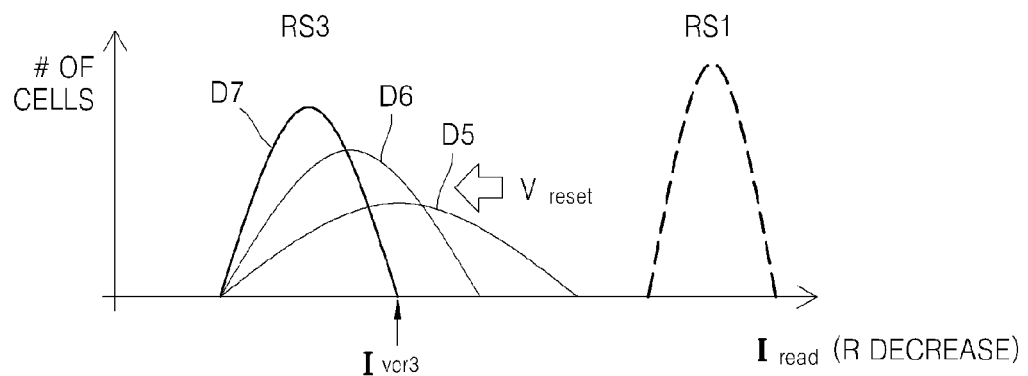
FIG. 25 is a graph showing a verify write operation in accordance with a second direction verify read operation in determining (S1550) whether a current resistance is lower than a low reference resistance in the method of FIG. 23.

FIG. 25 is a graph showing a verify write operation in accordance with a second direction verify read operation S1550 of FIG. 23. With reference to FIG. 25, the horizontal axis represents read current Iread, and the vertical axis represents number of the memory cells MC. In the present embodiment, a current resistance state of the plurality of memory cells MC is the first resistance state RS1, and a resistance state of the plurality of memory cells MC with respect to data that is to be programmed is the third resistance state RS3.

When the write voltage pulse Vreset is applied, resistance of the memory cells MC may be changed from the first resistance state RS1 to the third resistance state RS3. In this regard, as a result of performing a first program loop the distribution of the memory cells MC may be D5, as a result of performing a second program loop the distribution of the memory cells MC may be D6, and as a result of performing a third program loop the distribution of the memory cells MC may be D7.

In the first program loop, the write voltage pulse Vreset0 may be applied to the plurality of memory cells MC, and then the verify pulse Vread may be applied. In this regard, the control logic unit 13 may control the voltage control signal CTRL_vol such that the first verify write voltage pulse Vreset1 greater than the write voltage pulse Vreset0 may be applied to the memory cells MC that output a read current higher than a third reference read current Iver3 corresponding to a low reference resistance.

In the second program loop, the first verify write voltage pulse Vreset1 may be applied to the plurality of memory cells MC, and then the verify pulse Vread may be applied. In this regard, the control logic unit 13 may control the voltage control signal CTRL_vol such that a second verify write voltage pulse Vreset2 greater than the first verify write voltage pulse Vreset1 may be applied to the memory cells MC that output a read current higher than the third reference read current Iver3.

In the third program loop, the second verify write voltage pulse Vreset2 may be applied to the plurality of memory cells MC, and then the verify pulse Vread may be applied. As a result of performing the third program loop, the plurality of memory cells MC may have a read current greater than the third reference read current Iver3. In accordance with the present embodiment, thereafter, a first direction verify read operation may be performed on the plurality of memory cells MC.

Figure 26:
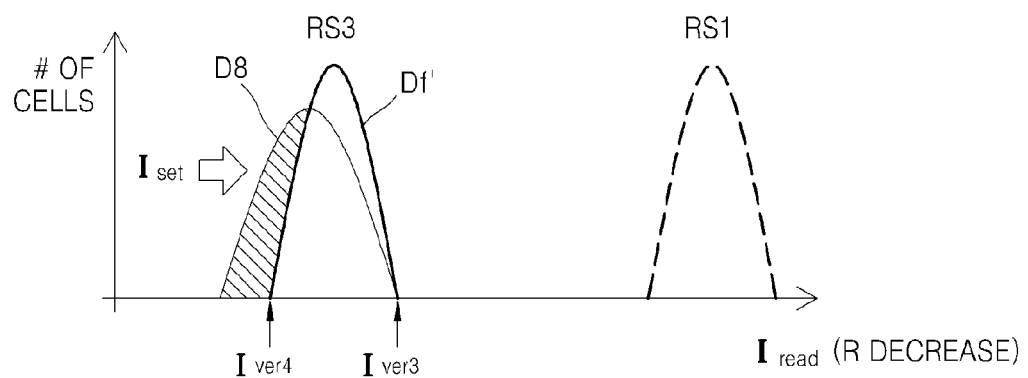
FIG. 26 is a graph showing a verify write operation in accordance with a first direction verify read operation in determining (S1560) whether a current resistance is higher than a high reference resistance in the method of FIG. 23.

FIG. 26 is a graph showing a verify write operation in accordance with a first direction verify read operation S1560 of FIG. 23. Referring to FIG. 26, the horizontal axis represents the read current Tread, and a vertical axis represents number of the memory cells MC. In the present embodiment, a current resistance state of the plurality of memory cells MC is the first resistance state RS1, and a resistance state of the plurality of memory cells MC with respect to data that is to be programmed is the third resistance state RS3.

When a write voltage pulse and a plurality of verify write voltage pulses are applied, distribution of the memory cells MC may be D8, and final distribution of the memory cells MC may be Df. Some of the memory cells MC corresponding to a slash area in D8 may be over-programmed memory cells. In the present embodiment, the verify write current pulse Iset may be applied to the over-programmed memory cells, and thus the plurality of memory cells MC may have the final distribution Df corresponding to the third resistance state RS3 that is to be programmed.

Figure 27:
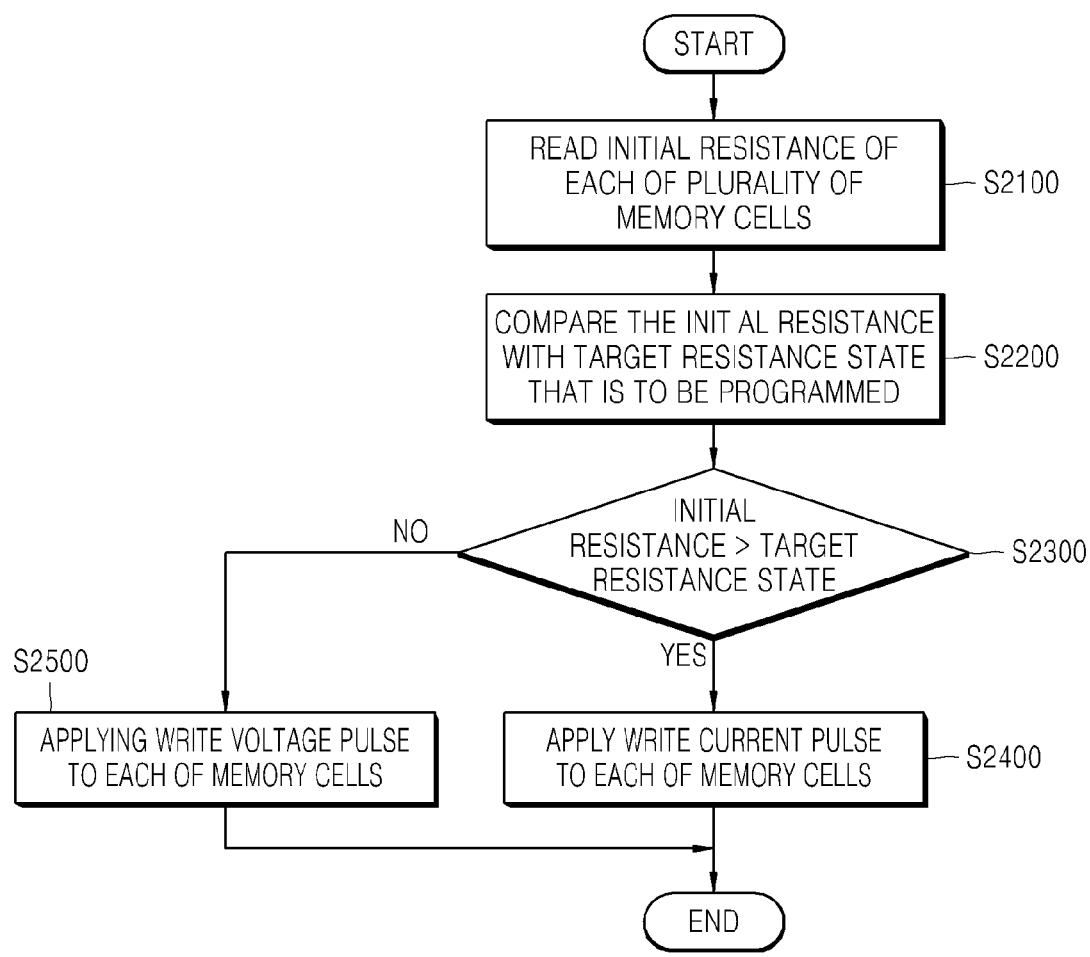
FIG. 27 is a flowchart of a method of operating a memory device, in accordance with another embodiment of the inventive concept.

FIG. 27 is a flowchart of a method of operating a memory device in accordance with another embodiment of the inventive concept. Referring to FIG. 27, an initial resistance Ri is read (S2100) from each of a plurality of memory cells. In more detail, the read circuit 122 may read the initial resistance Ri of the plurality of memory cells before a write pulse is applied.

Then the initial resistance Ri is compared (S2200) to the target resistance state Rt that is to be programmed to determine (S2300) whether the initial resistance Ri is higher than the target resistance state Rt. In an exemplary embodiment, the read circuit 122 may determine whether the initial resistance Ri is higher than a high threshold resistance. In another embodiment, the read circuit 122 may determine whether the initial resistance Ri is lower than a low threshold resistance.

As a result of this determination (S2300), if the initial resistance Ri is higher than the target resistance state Rt, then a write current pulse is applied (S2400) to each of the plurality of memory cells. In more detail, the first write circuit 1211 may be activated in response to the activated write mode signal WMD and provide the write current pulse to the memory cells, thereby performing a write operation on the memory cells.

Conversely, if it is determined (not greater less than or equal than the target resistance state Rt, a write voltage pulse is applied (S2500) to each of the plurality of memory cells. In more detail, the second write circuit 1212 may be activated in response to the inactivated write mode signal WMD and provide the write voltage pulse to the memory cells, thereby performing the write operation on the memory cells.

In accordance with another embodiment, a method of operating a resistive memory device includes reading resistance of each of a plurality of memory cells by applying a verify pulse to each of the plurality of memory cells, and applying a write current pulse or a write voltage pulse to each of the plurality of memory cells based on the read resistance. In addition, the method further includes reading resistance of each of the plurality of memory cells to which the write current pulse or the write voltage pulse is applied, and applying a verify write current pulse or a verify write voltage pulse to some of the plurality of memory cells based on the read resistance.

Figure 28:
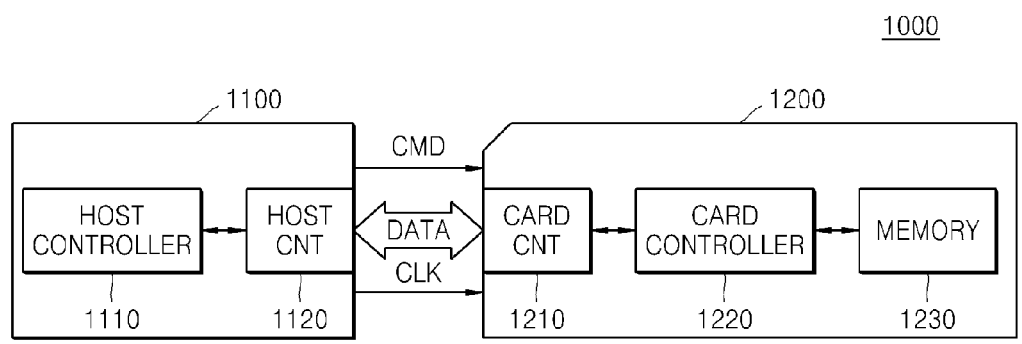
FIG. 28 is a block diagram of an example of a memory card system including a memory system in accordance with some embodiments of the inventive concept.

FIG. 28 is a block diagram of an example of a memory card system 1000 including a memory system in accordance with some embodiments of the inventive concept. Referring to FIG. 28, the memory card system 1000 may include a host 1100 and a memory card 1200. The host 1100 may include a host controller 1110 and a host connector 1120. The memory card 1200 may include a card connector 1210, a card controller 1220, and a memory device 1230. The memory card 1200 may be realized using the embodiments illustrated in FIGS. 1 through 27.

The host 1100 may write data to the memory card 1200 or may read data from the memory card 1200. The host controller 1110 may transmit a command signal CMD, a clock signal CLK generated from a clock generator (not shown) in the host 110, and data DATA to the memory card 1200 through the host connector 1120.

The card controller 1220 may receive the command signal CMD through the card connector 1210 to store the data DATA in the memory device 1230 in synchronization with a clock signal generated from a clock generator (not shown)

in the card controller 1220. That is, the memory device 1230 may store the data DATA outputted from the host 1100 therein.

The memory card 1200 may be a compact flash card (CFC), a Microdrive, a smart media card (SMC), a multi-media card (MMC), a security digital card (SDC), a memory stick (MC) or a universal serial bus (USB) for example.

Figure 29:
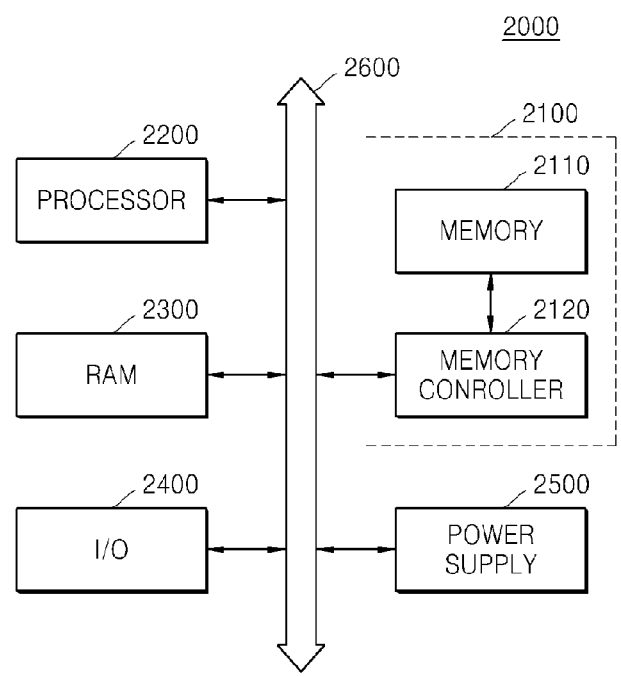
FIG. 29 is a block diagram of a computing system including a memory system in accordance with embodiments of the inventive concept.

FIG. 29 is a block diagram of a computing system 2000 including a memory system in accordance with embodiments of the inventive concept. Referring to FIG. 29, the computing system 2000 may include the memory system 2100, a processor 2200, a random access memory (RAM) 2300, an input/output (I/O) device 2400, and a power supply device 2500 for example. Although not shown in FIG. 29, the computing system 2000 may further include ports that are capable of communicating with a video card, a sound card, a memory card, a USB device, and/or other electronic systems. The computing system 2000 may be a personal computer or a portable electronic system such as a notebook computer, a mobile phone, a personal digital assistant (PDA) or a digital camera for example.

The processor 2200 may execute specific calculations or specific tasks. In some embodiments, the processor 2200 may be a micro-processor or a central processing unit (CPU). The processor 2200 may communicate with the RAM 2300, the I/O device 2400, and the memory system 2100 through a bus 2600 such as an address bus, a control bus or a data bus for example. The memory system 2100 may be realized using the embodiments illustrated in FIGS. 1 through 28.

In some embodiments, the processor 2200 may be connected to an expansion bus such as a peripheral component interconnect (PCI) bus for example.

The RAM 2300 may store data necessary for operations of the computing system 2000 therein. For example, the RAM 2300 may be realized using a DRAM device, a mobile DRAM device, an SRAM device, a PRAM device, an FRAM device, an RRAM device and/or an MRAM device for example.

The I/O device 2400 may include an input device such as a keyboard, a keypad or a mouse and an output device such as a printer or a display for example. The power supply device 2500 may supply a power supply voltage necessary for operations of the computing system 2000.

Figure 30:
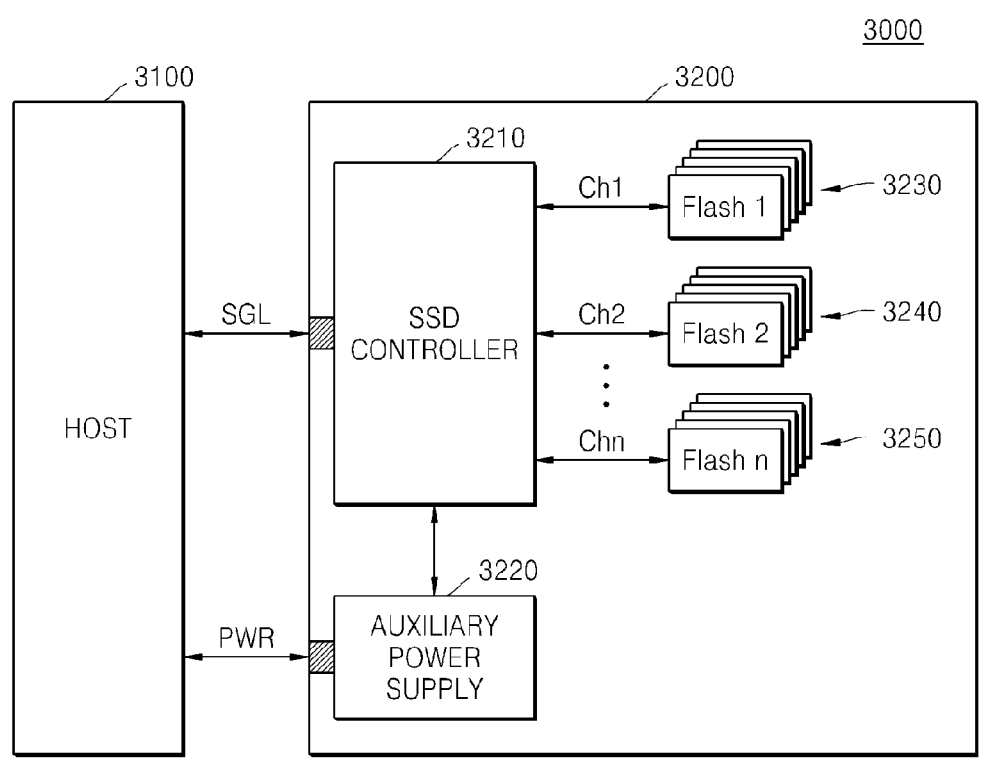
FIG. 30 is a block diagram of a solid state drive (SSD) system including a memory system in accordance with some embodiments of the inventive concept.

FIG. 30 is a block diagram of a solid state drive (SSD) system 3000 including a memory system in accordance with some embodiments of the inventive concept. Referring to FIG. 30, the SSD system 3000 may include a host 3100 and an SSD 3200. The SSD 3200 may transmit or receive signals SGL to or from the host 3100 through a signal connector and may receive a power supply voltage signal PWR outputted from the host 3100 through a power connector. The SSD system 3200 may include an SSD controller 3210, an auxiliary power supply device 3220, and a plurality of memory devices 3230, 3240 and 3250. The SSD 3200 may be realized using the embodiments illustrated in FIGS. 1 through 29.

While the inventive concept has been particularly shown and described with reference to exemplary embodiments thereof, it will be understood that various changes in form and details may be made therein without departing from the spirit and scope of the following claims.

What is claimed is:

1. A method of operating a resistive memory device including a plurality of memory cells, the method comprising:

applying a write pulse to each of the plurality of memory cells such that each of the plurality of memory cells has a target resistance state between a first reference resistance and a second reference resistance higher than the first reference resistance;

reading resistance of each of the plurality of memory cells by applying a verify pulse to each of the plurality of memory cells;

applying a verify write current pulse to each of the memory cells from among the plurality of memory cells that has resistance higher than the second reference resistance; and applying a verify write voltage pulse to each of the memory cells from among the plurality of memory cells that has resistance lower than the first reference resistance.

2. The method of claim 1, including reading initial resistance of each of the plurality of memory cells before applying the write pulse.

3. The method of claim 2, wherein applying the write pulse includes applying a write current pulse to each of the memory cells that has initial resistance higher than the target resistance state.

4. The method of claim 3, wherein reading resistance of each of the plurality of memory cells includes performing a first direction verify read operation to determine whether each respective resistance is higher than the second reference resistance.

5. The method of claim 4, including performing a second direction verify read operation after applying the verify write current pulse to determine whether each respective resistance is lower than the first reference resistance.

6. The method of claim 3, wherein at least one of amplitude and/or width of the verify write current pulse is greater than at least one of amplitude and/or width of the write current pulse.

7. The method of claim 2, wherein applying the write pulse includes applying a write voltage pulse to the memory cells that have initial resistance lower than the target resistance state.

8. The method of claim 7, wherein reading resistance of each of the plurality of memory cells includes performing a second direction verify read operation to determine whether each respective resistance is higher than the first reference resistance.

9. The method of claim 8, including performing a first direction verify read operation after applying the verify write voltage pulse to determine whether each respective resistance is higher than the second reference resistance.

10. The method of claim 7, wherein at least one of amplitude and/or width of the verify write voltage pulse is greater than at least one of amplitude and/or width of the write voltage pulse.

11. The method of claim 7, wherein polarities of the write voltage pulse and the verify write voltage pulse are opposite to polarity of the verify pulse.

12. A method of operating a resistive memory device including a plurality of memory cells, the method comprising:

reading initial resistance of each of the plurality of memory cells;

comparing each respective initial resistance with a target resistance state that is to be programmed;

applying a write current pulse to each of the plurality of memory cells if its respective initial resistance is higher than the target resistance state; and applying a write voltage pulse to each of the plurality of memory cells if its respective initial resistance is lower than the target resistance state.

13. The method of claim 12, further comprising reading a current resistance of each of the plurality of memory cells by applying a verify pulse to each of the plurality of memory cells to which the write current pulse or the write voltage pulse is applied.

14. The method of claim 13, wherein the target resistance state corresponds to a resistance between a first reference resistance and a second reference resistance higher than the first reference resistance, further comprising:
applying a verify write current pulse to each of the plurality of memory cells if its respective current resistance is higher than the second reference resistance.

15. The method of claim 13, wherein the target resistance state corresponds to a resistance between a first reference resistance and a second reference resistance higher than the first reference resistance,
the method further comprising applying a verify write voltage pulse to each of the plurality of memory cells if its respective current resistance is lower than the first reference resistance.

16. A memory system with resistive memory device, comprising:
a resistive memory device including a memory cell array and a write/read circuit, the memory cell array comprising a plurality of memory cells; and
a memory controller,
wherein the write/read circuit is configured in conjunction with control logic to:
apply a write pulse to each of the plurality of memory cells such that each of the plurality of memory cells has a target resistance state between a first reference resistance and a second reference resistance higher than the first reference resistance;
read resistance of each of the plurality of memory cells by applying a verify pulse to each of the plurality of memory cells;
apply a verify write current pulse to each of the memory cells from among the plurality of memory cells that has resistance higher than the second reference resistance; and
apply a verify write voltage pulse to each of the memory cells from among the plurality of memory cells that has resistance lower than the first reference resistance.

17. The memory system of claim 16, the write/read circuit being configured to read initial resistance of each of the plurality of memory cells before applying the write pulse.

18. The memory system of claim 17, wherein applying the write pulse includes applying a write current pulse to each of the memory cells that has initial resistance higher than the target resistance state.

19. The memory system of claim 18, wherein reading resistance of each of the plurality of memory cells includes performing a first direction verify read operation to determine whether each respective resistance is higher than the second reference resistance.

20. The memory system of claim 19, the write/read circuit being configured to performing a second direction verify read operation after applying the verify write current pulse to determine whether each respective resistance is lower than the first reference resistance.

* * * * *